US009317140B2

(12) United States Patent
Rosenfeld et al.

(10) Patent No.: US 9,317,140 B2
(45) Date of Patent: Apr. 19, 2016

(54) METHOD OF MAKING A MULTI-TOUCH INPUT DEVICE FOR DETECTING TOUCH ON A CURVED SURFACE

(75) Inventors: Daniel Rosenfeld, Seattle, WA (US); Jonathan Westhues, Bellevue, WA (US); Shahram Izadi, Cambridge (GB); Nicolas Villar, Cambridge (GB); Hrvoje Benko, Seattle, WA (US); John Helmes, Cambridge (GB); Kurt Allen Jenkins, Sammamish, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 625 days.

(21) Appl. No.: 12/488,425

(22) Filed: Jun. 19, 2009

(65) Prior Publication Data

US 2010/0242274 A1    Sep. 30, 2010

Related U.S. Application Data

(60) Provisional application No. 61/164,830, filed on Mar. 30, 2009.

(51) Int. Cl.
*G06F 3/0354*    (2013.01)
*H01L 41/08*    (2006.01)
(Continued)

(52) U.S. Cl.
CPC .......... *G06F 3/03543* (2013.01); *G06F 3/0202* (2013.01); *G06F 3/0383* (2013.01);
(Continued)

(58) Field of Classification Search
CPC .............. G06F 3/0202; G06F 3/03541; G06F 3/03543; G06F 3/041; G06F 3/0412; G06F 3/0414; G06F 3/0383; G06F 3/044; G06F 2203/0337; G06F 2203/0411; H01H 3/141; H03K 17/96; H03K 17/962; Y10T 29/49124; Y10T 29/49128; Y10T 29/4913; Y10T 29/49155; Y10T 29/49158; H01L 41/0825; H01L 41/113; H01L 41/1132
USPC ........ 29/829, 831, 832, 846, 25.35, 842, 830; 345/55, 163, 173
See application file for complete search history.

(56) References Cited

U.S. PATENT DOCUMENTS

| 4,550,221 | A | | 10/1985 | Mabusth | |
|---|---|---|---|---|---|
| 4,659,873 | A | * | 4/1987 | Gibson et al. ............. | 345/173 X |

(Continued)

FOREIGN PATENT DOCUMENTS

| CN | 101324827 A | 12/2008 |
|---|---|---|
| CN | 101632057 A | 1/2010 |

(Continued)

OTHER PUBLICATIONS

Smythe, Elizabeth J. et al., "A Technique to Transfer Metallic Nanoscale Patterns to Small and Non-Planar Surfaces," <http://pubs.acs.org/doi/abs/10.1021/nn800720r>, ACS Nano, 2009, 3 (1), 59-65, Publication date (Web): Dec. 30, 2008, 8 pages.

(Continued)

*Primary Examiner* — A. Dexter Tugbang
(74) *Attorney, Agent, or Firm* — Judy Yee; Micky Minhas

(57) ABSTRACT

Embodiments are disclosed herein that are related to input devices with curved multi-touch surfaces. For example, in one disclosed embodiment, a method of making a multi-touch input device having a curved touch-sensitive surface comprises forming on a substrate an array of sensor elements defining a plurality of pixels of the multi-touch sensor, forming the substrate into a shape that conforms to a surface of the curved geometric feature of the body of the input device, and fixing the substrate to the curved geometric feature of the body of the input device.

20 Claims, 12 Drawing Sheets

(51) Int. Cl.

| | | |
|---|---|---|
| *G06F 3/02* | (2006.01) | |
| *G06F 3/041* | (2006.01) | |
| *H01H 3/14* | (2006.01) | |
| *H01L 41/113* | (2006.01) | |
| *G06F 3/038* | (2013.01) | |
| *G06F 3/044* | (2006.01) | |
| *H03K 17/96* | (2006.01) | |

(52) U.S. Cl.
CPC ............ *G06F3/03541* (2013.01); *G06F 3/041* (2013.01); *G06F 3/044* (2013.01); *G06F 3/0412* (2013.01); *G06F 3/0414* (2013.01); *H01H 3/141* (2013.01); *H01L 41/0825* (2013.01); *H01L 41/113* (2013.01); *H01L 41/1132* (2013.01); *G06F 2203/0337* (2013.01); *G06F 2203/04111* (2013.01); *H03K 17/96* (2013.01); *H03K 17/962* (2013.01); *Y10T 29/4913* (2015.01); *Y10T 29/49124* (2015.01); *Y10T 29/49128* (2015.01); *Y10T 29/49155* (2015.01); *Y10T 29/49158* (2015.01)

(56) References Cited

U.S. PATENT DOCUMENTS

| | | | | |
|---|---|---|---|---|
| 5,008,497 | A | | 4/1991 | Asher |
| 5,316,605 | A | | 5/1994 | Rakonjac et al. |
| 5,831,597 | A | | 11/1998 | West et al. |
| 5,869,791 | A | * | 2/1999 | Young ................. 178/20.01 |
| 5,982,302 | A | | 11/1999 | Ure |
| 5,997,996 | A | | 12/1999 | Tamura |
| 6,057,903 | A | * | 5/2000 | Colgan et al. ............. 345/173 X |
| 6,304,091 | B1 | | 10/2001 | Shahoian et al. |
| 6,813,957 | B1 | | 11/2004 | Platz |
| 6,833,825 | B1 | | 12/2004 | Farag et al. |
| 6,943,705 | B1 | * | 9/2005 | Bolender et al. .......... 345/173 X |
| 7,138,620 | B2 | * | 11/2006 | Trisnadi et al. .......... 345/166 X |
| 7,168,047 | B1 | | 1/2007 | Huppi |
| 7,209,116 | B2 | * | 4/2007 | Gates et al. ............... 345/163 X |
| 7,477,242 | B2 | | 1/2009 | Cross et al. |
| 2002/0067334 | A1 | | 6/2002 | Hinckley et al. |
| 2003/0025679 | A1 | | 2/2003 | Taylor et al. |
| 2003/0076649 | A1 | | 4/2003 | Speakman |
| 2003/0227441 | A1 | | 12/2003 | Hioki et al. |
| 2003/0234769 | A1 | | 12/2003 | Cross et al. |
| 2004/0022010 | A1 | | 2/2004 | Shigetaka |
| 2005/0030048 | A1 | | 2/2005 | Bolender et al. |
| 2005/0078087 | A1 | | 4/2005 | Gates et al. |
| 2005/0162402 | A1 | | 7/2005 | Watanachote |
| 2005/0253643 | A1 | * | 11/2005 | Inokawa et al. ......... 29/25.35 X |
| 2006/0097991 | A1 | | 5/2006 | Hotelling et al. |
| 2006/0176277 | A1 | | 8/2006 | Daniel et al. |
| 2006/0238517 | A1 | | 10/2006 | King et al. |
| 2006/0254369 | A1 | | 11/2006 | Yoon et al. |
| 2006/0274055 | A1 | * | 12/2006 | Reynolds et al. ............. 345/174 |
| 2006/0278444 | A1 | | 12/2006 | Binstead |
| 2007/0200823 | A1 | | 8/2007 | Bytheway et al. |
| 2007/0229469 | A1 | | 10/2007 | Seguine |
| 2008/0111792 | A1 | | 5/2008 | Roberts et al. |
| 2008/0150906 | A1 | | 6/2008 | Grivna |
| 2008/0158172 | A1 | | 7/2008 | Hotelling et al. |
| 2008/0162996 | A1 | | 7/2008 | Krah et al. |
| 2008/0165140 | A1 | | 7/2008 | Christie et al. |
| 2008/0180399 | A1 | | 7/2008 | Cheng |
| 2008/0264699 | A1 | | 10/2008 | Chang et al. |
| 2008/0297478 | A1 | | 12/2008 | Hotelling et al. |
| 2008/0303799 | A1 | | 12/2008 | Schwesig et al. |
| 2008/0309635 | A1 | | 12/2008 | Matsuo |
| 2009/0009482 | A1 | | 1/2009 | McDermid |
| 2009/0058687 | A1 | | 3/2009 | Rothkopf et al. |
| 2009/0066669 | A1 | | 3/2009 | Olson |
| 2009/0091551 | A1 | | 4/2009 | Hotelling et al. |
| 2009/0219257 | A1 | | 9/2009 | Frey et al. |
| 2009/0237374 | A1 | | 9/2009 | Li et al. |
| 2009/0273570 | A1 | | 11/2009 | Degner et al. |
| 2009/0273584 | A1 | | 11/2009 | Staton et al. |
| 2009/0277578 | A1 | | 11/2009 | Sung et al. |
| 2010/0079384 | A1 | | 4/2010 | Grivna |
| 2010/0164889 | A1 | | 7/2010 | Hristov et al. |
| 2010/0245286 | A1 | | 9/2010 | Parker |

FOREIGN PATENT DOCUMENTS

| | | | | |
|---|---|---|---|---|
| EP | 1400891 | A2 | 3/2004 | |
| JP | 04326792 | A | * 11/1992 | ................. 29/829 |
| JP | H09292598 | A | 11/1997 | |
| JP | 2000148376 | A | 5/2000 | |
| JP | 2003091360 | A | 3/2003 | |
| JP | 2004265100 | A | 9/2004 | |
| JP | 2005267478 | A | 9/2005 | |
| JP | 2008140130 | A | 6/2008 | |
| JP | 2008216543 | A | 9/2008 | |
| JP | 2008226100 | A | 9/2008 | |
| JP | 2008541268 | A | 11/2008 | |
| RU | 2029353 | C1 | 2/1995 | |
| RU | 2267183 | C2 | 12/2005 | |
| WO | 2007099733 | A1 | 9/2007 | |
| WO | 2008000964 | A1 | 1/2008 | |
| WO | 2008131544 | A1 | 11/2008 | |
| WO | 2010117664 | A2 | 10/2010 | |

OTHER PUBLICATIONS

"Apple Extending Multi-Touch to Mice," hrmpf.com, <http://hrmpf.com/wordpress/131/apple-extending-multi-touch-to-mice>, Jul. 5, 2007, 6 pages.

Engel, Jonathan et al., "Development of polyimide flexible tactile sensor skin," Journal of Micromechanics and Mircoengineering, 13 (2003) 359-366, Published Feb. 24, 2003, 8 pages.

"International Search Report", Mailed Date: Oct. 28, 2010, Application No. PCT/US2010/028720, Filed Date: Mar. 25, 2010, pp. 10.

"Slim Mouse Replaces Scroll Wheel with Touch Sensor", Retrieved at <<http://techiesden.com/2007/11/18/slim-mouse-replaces-scroll-wheel-with-touch-sensor/>>, Nov. 18, 2007, pp. 1-2.

"LG XM-900 4D Mouse: 4D Scroll Wheel with Touch Sensor", Retrieved at <<http://www.product-reviews.net/2007/12/13/lg-xm-900-4d-mouse-4d-scroll-wheel-with-touch-sensor/>>, Dec. 13, 2007, pp. 1-6.

"Wireless Mouse with Touch Sensitive Technology", Retrieved at <<http://suppliers.jimtrade.com/151/150941/85201.htm, Mar. 13, 2009, pp. 1-2.

"International Search Report", Mailed Date: Oct. 28, 2010, Application No. PCT/US2010/028823, Filed Date: Mar. 26, 2010, p. 9.

ISA European Patent Office, Extended European Search Report of EP10762121, Aug. 14, 2012, Germany, 14 pages.

Australian Government; Patent Examination Report No. 2, Australian Patent Application No. 2010260482, Mailing Date May 19, 2014; 5 pages.

Australian Government; Patent Examination Report No. 2, Australian Patent Application No. 2010234912, Mailing Date May 23, 2014; 4 pages.

State Intellectual Property Office, P.R. China; Second Office Action, Chinese Patent Application No. 201080015267.8; Mailing Date Apr. 22, 2014, 6 pages.

Australian Intellectual Property Office, Notice of Acceptance issued in Australian Patent Application No. 2010234912, Jul. 29, 2014, 3 pages.

Australian Intellectual Property Office, Notice of Acceptance issued in Australian Patent Application No. 2010260482, Jul. 22, 2014, 3 pages.

State Intellectual Property Office of the People's Republic of China, Second Office Action issued in Chinese Patent Application No. 201080015282.2, Jun. 16, 2014, 8 pages.

Russian Federal Service for Intellectual Property, Notice of Allowance issued in Russian Patent Application No. 2011139712, Jun. 6, 2014, 13 pages.

State Intellectual Property Office of China, Office Action for Chinese Patent Application No. 201080015282.2, Sep. 29, 2013, 8 pages.

(56) References Cited

OTHER PUBLICATIONS

Japan Patent Office, Office Action for Japanese Patent Application No. 2012-503524, Jan. 23, 2014, 5 pages.
Japan Patent Office, Office Action for Japanese Patent Application No. 2012-516079, Feb. 10, 2014, 6 pages.
IP Australia, Office Action for Australian Patent Application No. 2010260482, Mar. 15, 2014, 4 pages.
IP Australia, Office Action for Australian Patent Application No. 2010234912, Mar. 21, 2014, 3 pages.
ISA European Patent Office, Search Report of EP10789889.2, Mar. 1, 2013, Germany, 13 pages.
Japanese Patent Office, Notice of Allowance Issued in Application No. 2012-516079, Dec. 4, 2014, 4 pages.
Japanese Patent Office, Office Action Issued in Japanese Patent Application No. 2012-503524, Sep. 5, 2014, 8 Pages.
State Intellectual Property Office of the People's Republic of China, Fourth Office Action Issued in Chinese Patent Application No. 201080015282.2, Jul. 10, 2015, 6 Pages.

\* cited by examiner

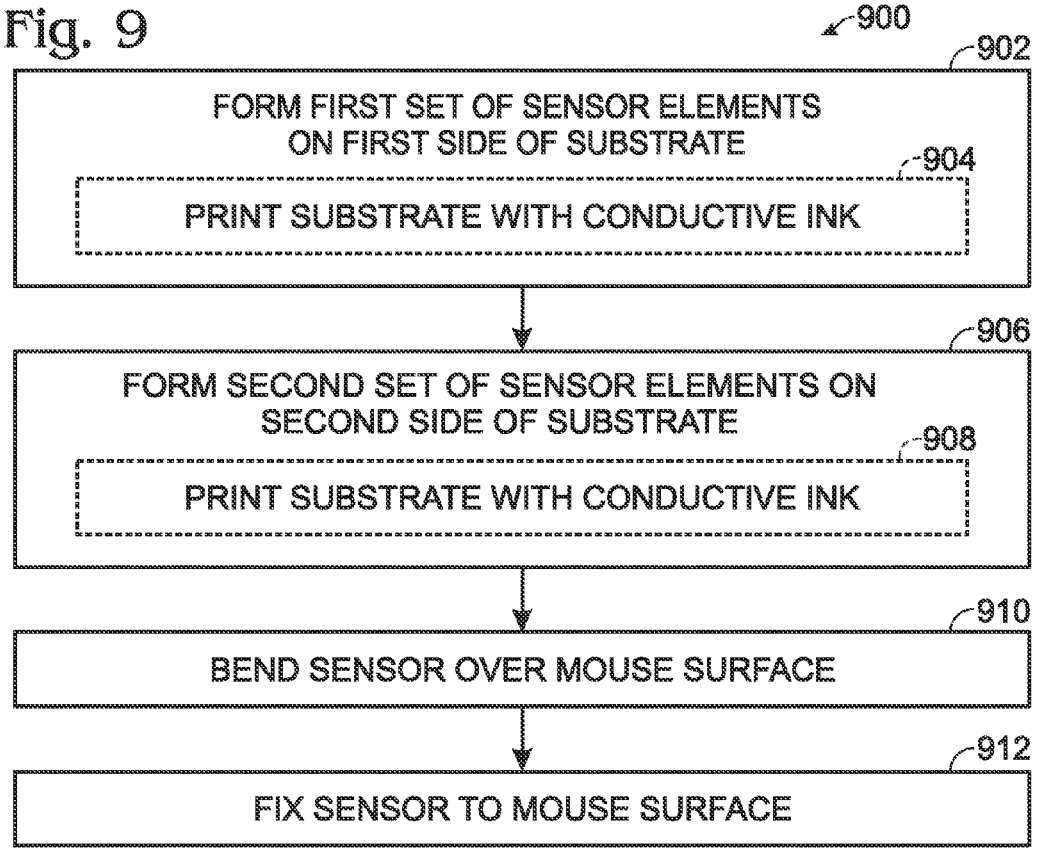
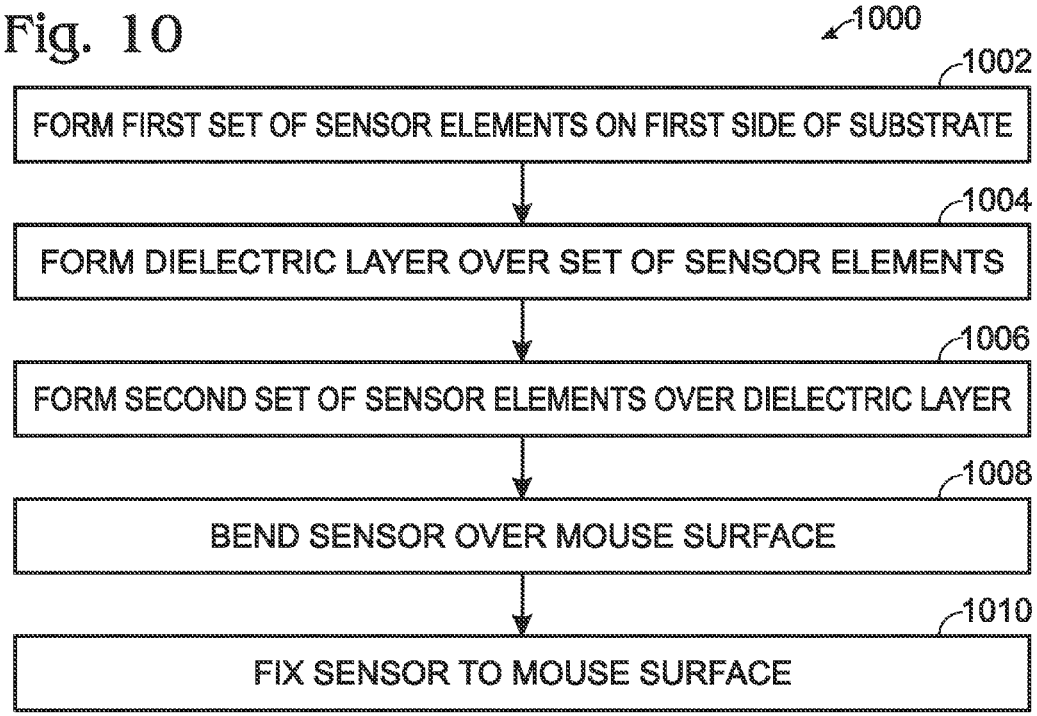

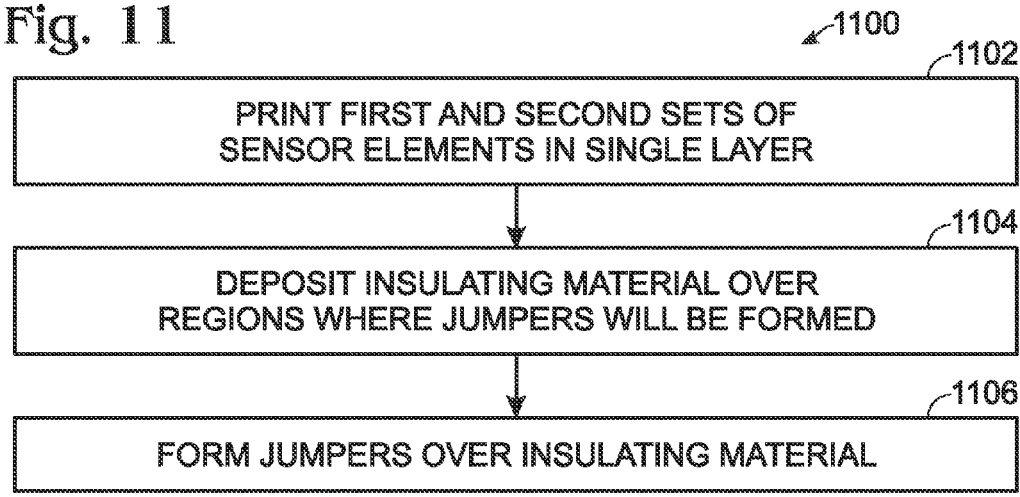

Fig. 11

1100
1102 PRINT FIRST AND SECOND SETS OF SENSOR ELEMENTS IN SINGLE LAYER
1104 DEPOSIT INSULATING MATERIAL OVER REGIONS WHERE JUMPERS WILL BE FORMED
1106 FORM JUMPERS OVER INSULATING MATERIAL

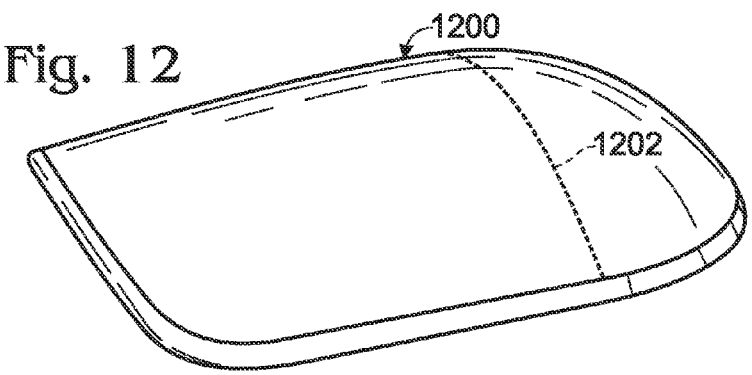

Fig. 12

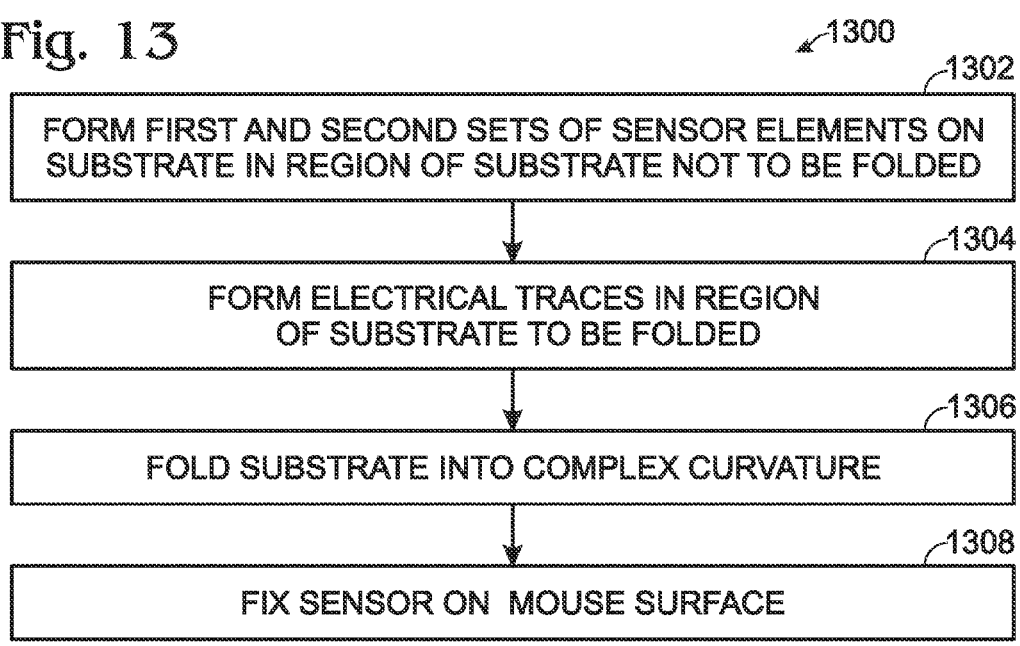

Fig. 13

1300
1302 FORM FIRST AND SECOND SETS OF SENSOR ELEMENTS ON SUBSTRATE IN REGION OF SUBSTRATE NOT TO BE FOLDED
1304 FORM ELECTRICAL TRACES IN REGION OF SUBSTRATE TO BE FOLDED
1306 FOLD SUBSTRATE INTO COMPLEX CURVATURE
1308 FIX SENSOR ON MOUSE SURFACE

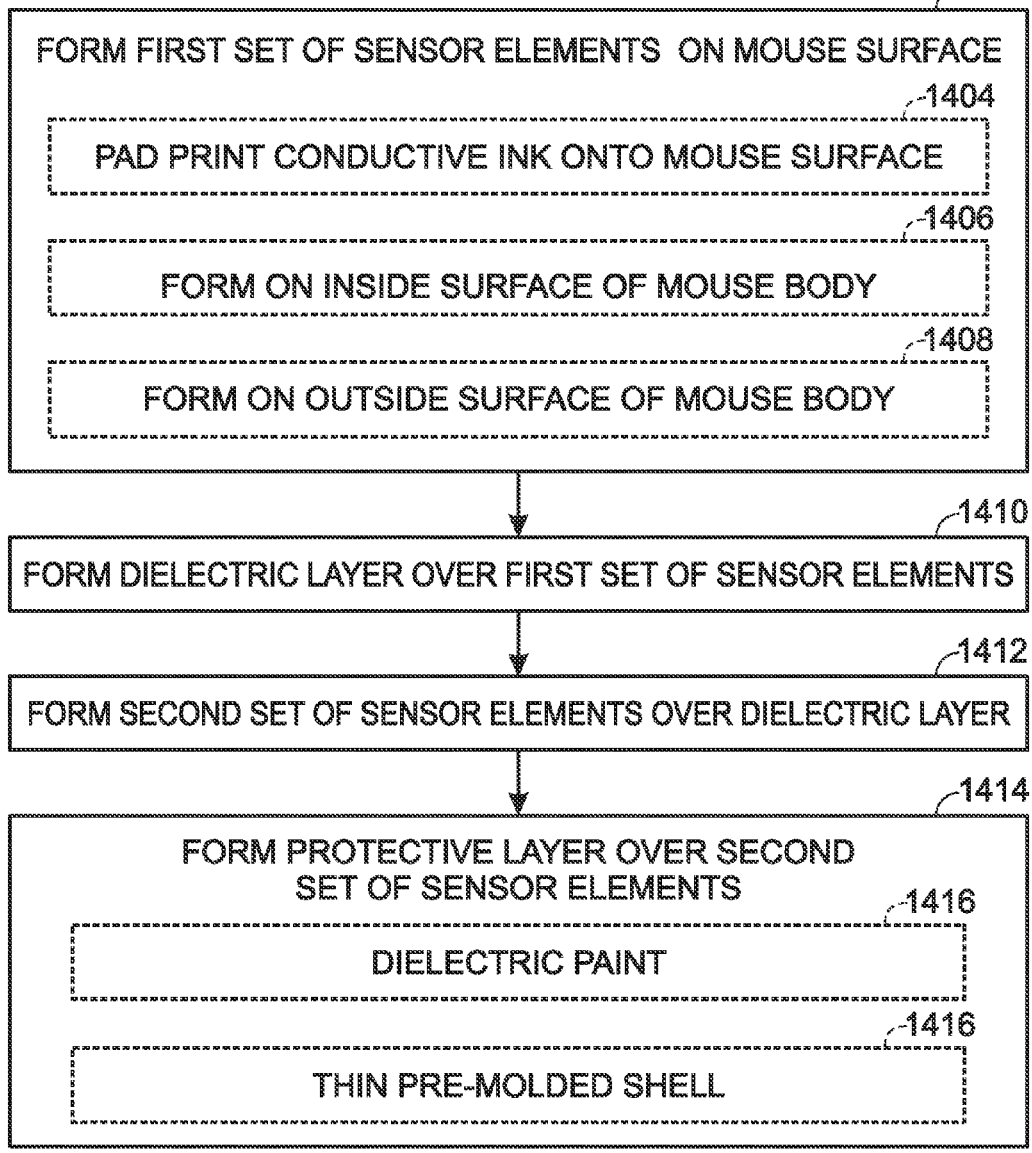
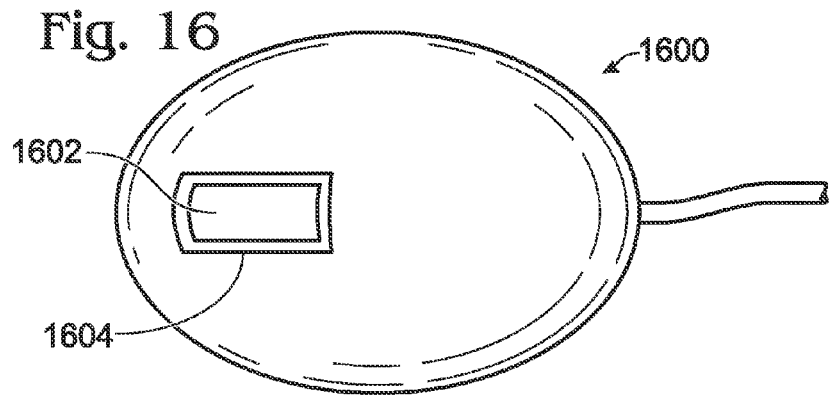

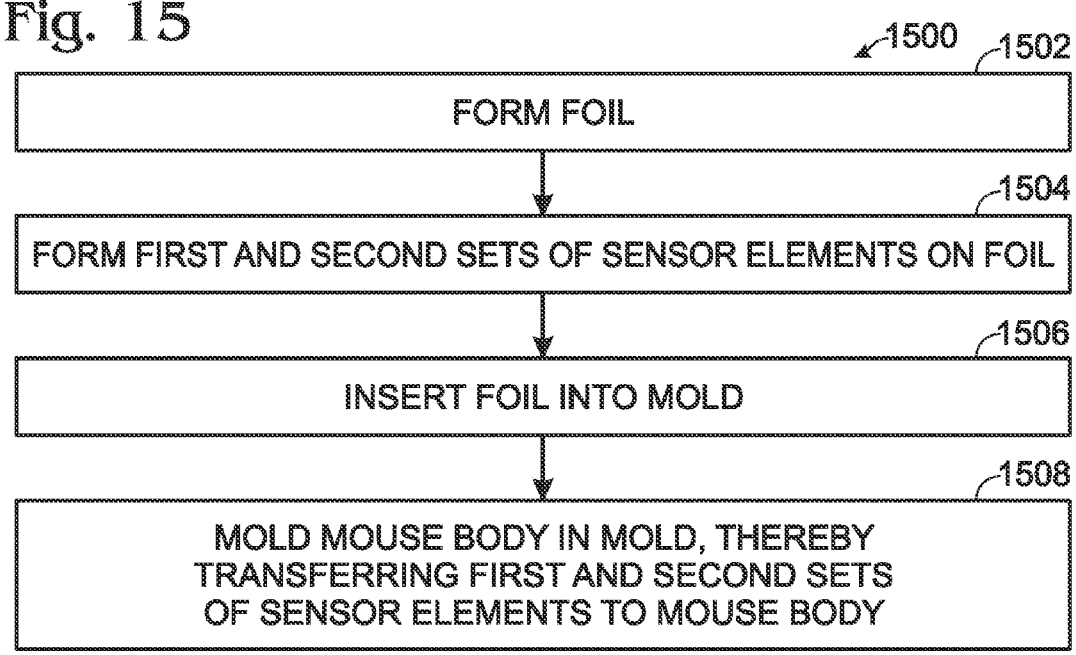
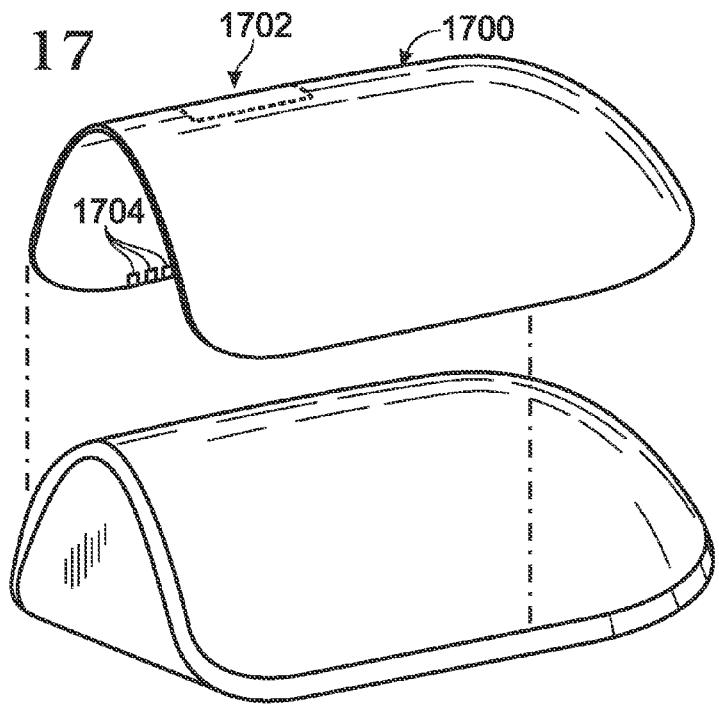

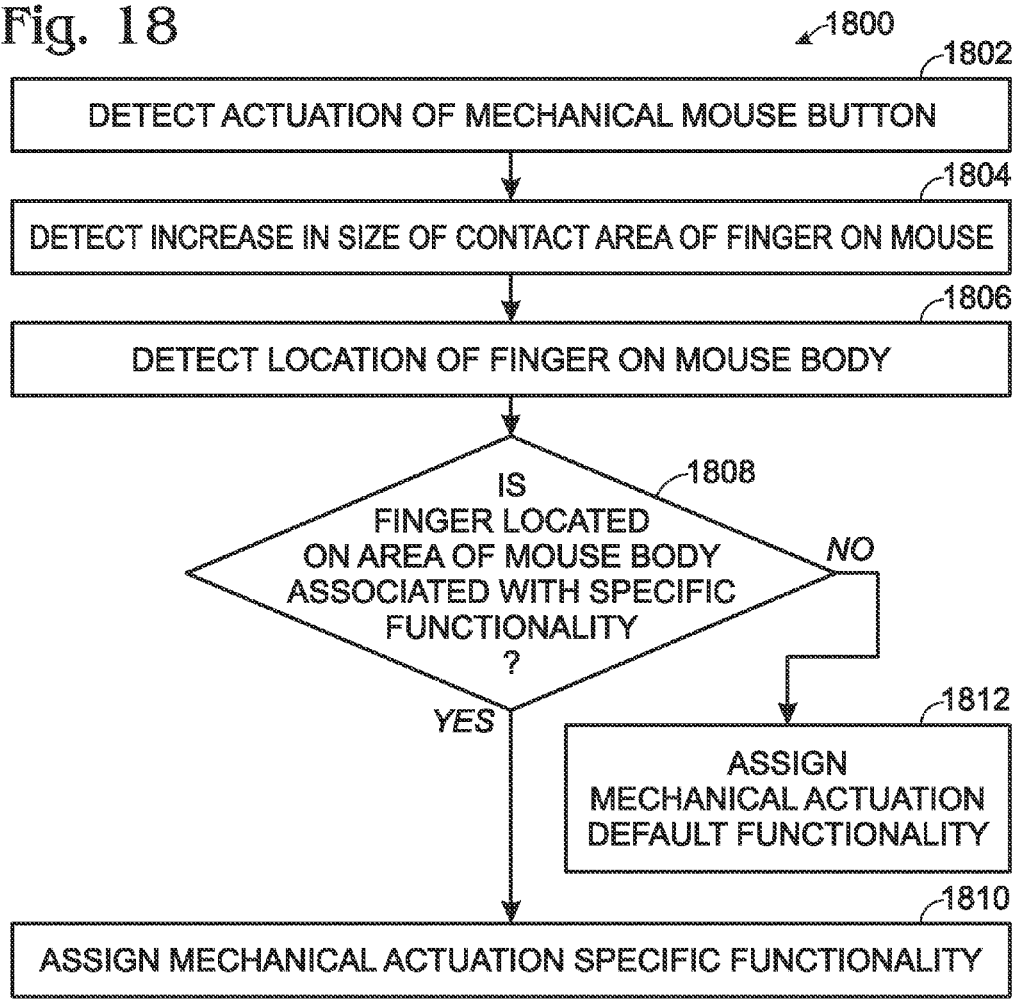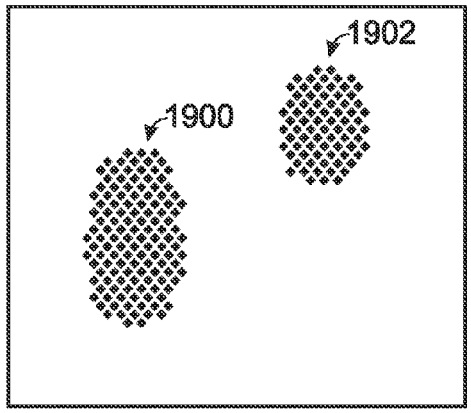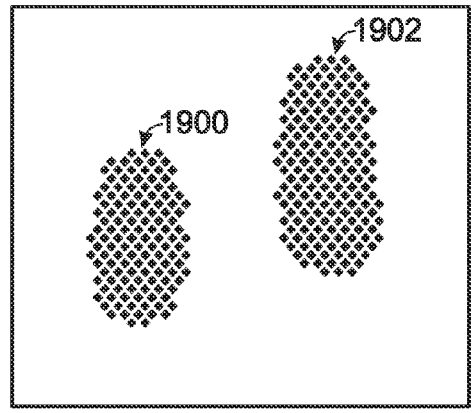

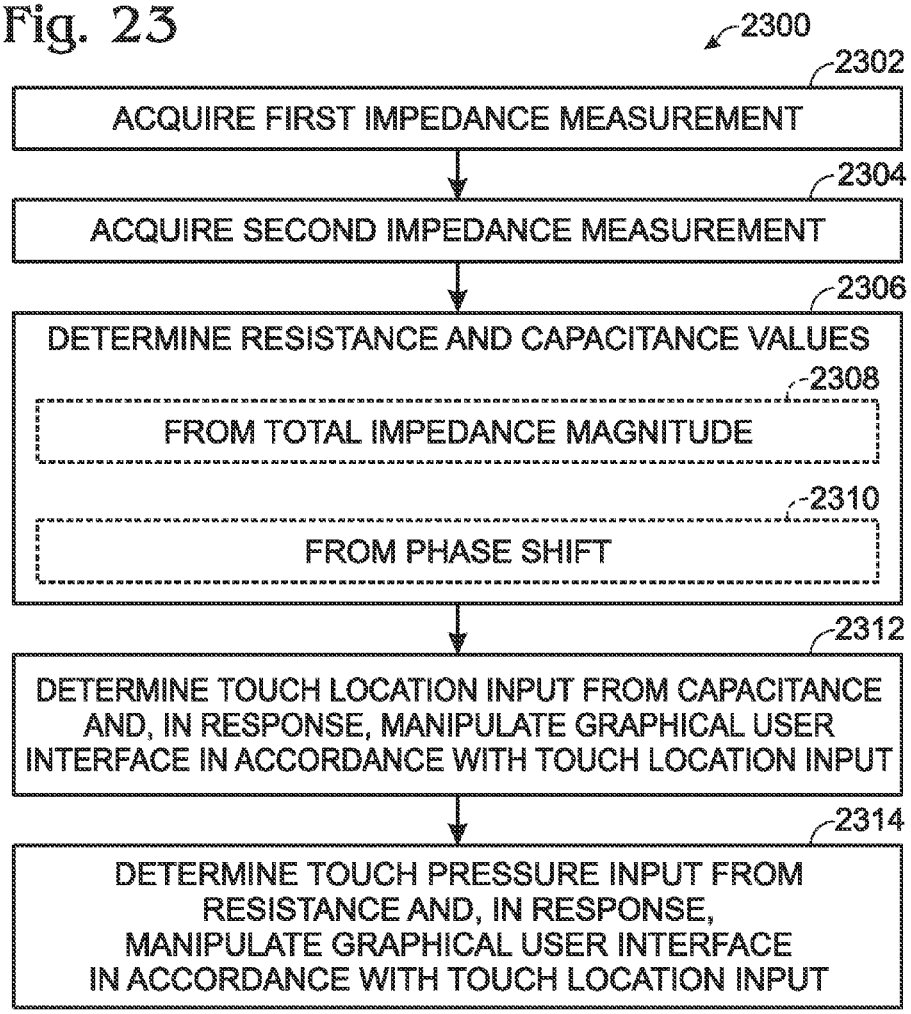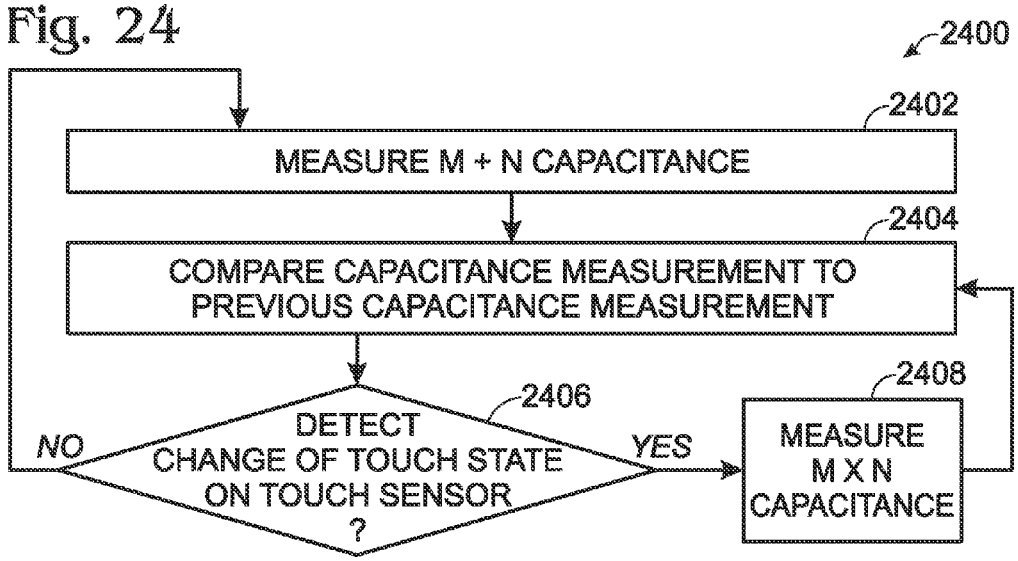

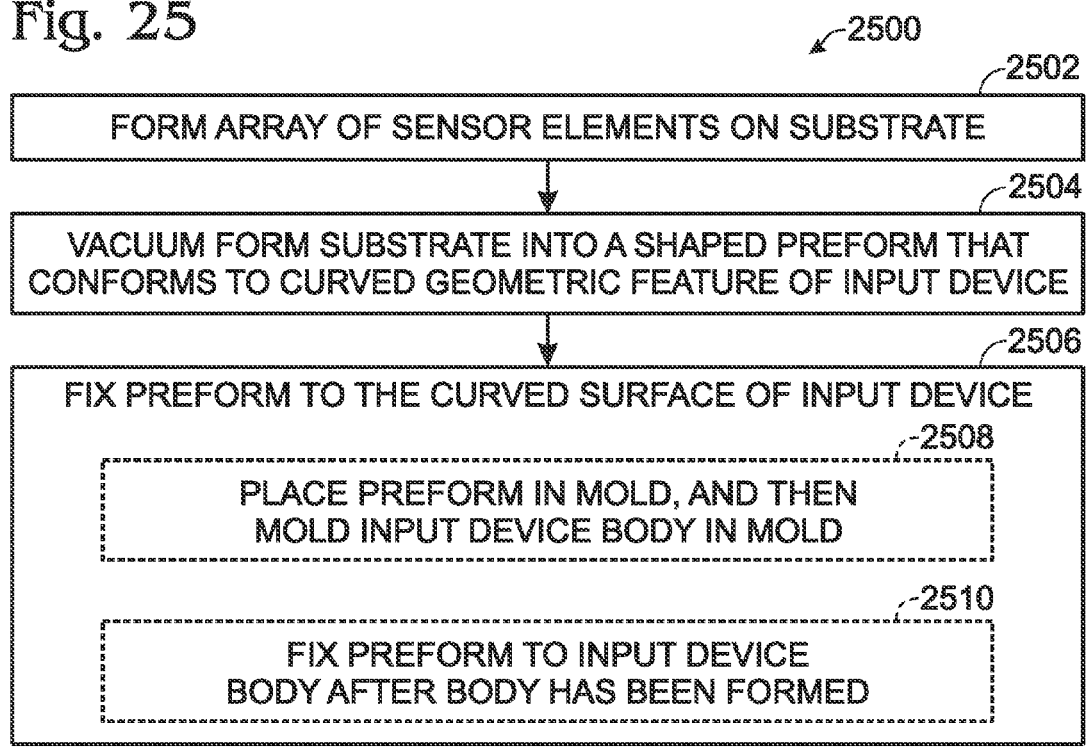
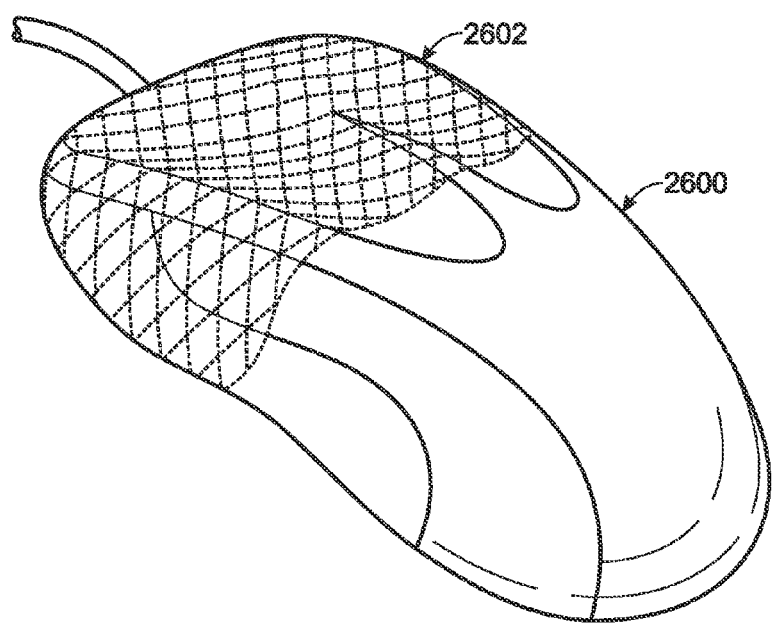

METHOD OF MAKING A MULTI-TOUCH INPUT DEVICE FOR DETECTING TOUCH ON A CURVED SURFACE

CROSS-REFERENCE TO RELATED APPLICATIONS

This application claims priority to U.S. Provisional Patent Application No. 61/164,830, filed Mar. 30, 2009 entitled "Computer Mouse with Touch-Sensitive Surface" the entire contents of which are hereby incorporated herein by reference for all purposes.

BACKGROUND

Various input devices allow users to interact with graphical user interfaces on computing devices. For example, multi-touch displays utilize a multi-touch sensor disposed over a computer display device allow a user to interact with content displayed on a graphical user interface via natural, intuitive gestures. Multi-touch displays may detect touch via various mechanisms, including capacitive and vision-based mechanisms. However, in some use environments, multi-touch displays may pose various problems. For example, a vertically-oriented multi-touch display, such as that which may be used with a desktop computer, may cause user fatigue due to the arm position maintained by a user.

Computer mice also allow users to interact with a graphical user interface via a cursor displayed on the display that tracks movement of the mouse. Computer mice may be used comfortably for extended periods of time. However, due to the cursor-based input paradigm utilized by mouse-based graphical user interfaces, opportunities for natural movement-based interactions with the graphical user interface are more restricted than with touch-based input systems.

SUMMARY

Accordingly, various embodiments are disclosed herein that are related to input devices with curved multi-touch surfaces. For example, in one disclosed embodiment, a method of making a multi-touch input device having a curved touch-sensitive surface comprises forming on a substrate an array of sensor elements defining a plurality of pixels of the multi-touch sensor, forming the substrate into a shape that conforms to a surface of the curved geometric feature of the body of the input device, and fixing the substrate to the curved geometric feature of the body of the input device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 9 shows an embodiment of a method of manufacturing a computer mouse with a multi-touch surface.

FIG. 10 shows another embodiment of a method of manufacturing a computer mouse with a multi-touch surface.

FIG. 11 shows another embodiment of a method of manufacturing a computer mouse with a multi-touch surface.

FIG. 12 shows an embodiment of a mouse with a developable surface suitable for use with the embodiments of FIGS. 9-11.

FIG. 13 shows an embodiment of a method of manufacturing a computer mouse with a multi-touch surface having a complex curvature.

FIG. 14 shows another embodiment of a method of manufacturing a computer mouse with a multi-touch surface having a complex curvature.

FIG. 15 shows another embodiment of a method of manufacturing a computer mouse with a multi-touch surface having a complex curvature.

FIG. 16 shows an embodiment of a computer mouse having an indicator light that indicates a boundary of a region of a touch-sensitive surface that is mapped to a specific function.

FIG. 17 shows an embodiment of a cover for a computer mouse that is configured to map specific functionalities to one or more regions of a touch sensor on a computer mouse.

FIG. 18 shows an embodiment of a method for detecting a region of a touch sensor on a mouse that is associated with an actuation of a mechanical actuator.

FIG. 19 shows an embodiment of a signal detected by a touch sensor of a computer mouse before actuation of a mechanical actuator.

FIG. 20 shows an embodiment of a signal detected by a touch sensor of a computer mouse after actuation of a mechanical actuator.

FIG. 23 shows a flow diagram depicting an embodiment of a method of measuring touch location and touch pressure via the embodiment of FIG. 21.

FIG. 24 shows a flow diagram depicting an embodiment of a method of operating a capacitive touch sensor.

FIG. 25 shows a flow diagram depicting another embodiment of a method of forming an input device comprising a touch sensor.

FIG. 26 shows an embodiment of a computer mouse comprising a capacitive touch sensor disposed over a non-developable surface of the mouse.

DETAILED DESCRIPTION

Embodiments are disclosed herein that relate to input devices with curved multi-touch surfaces. For example, some embodiments relate to the detection of location-based touch inputs on a surface of a computer mouse for use as input for a computing device. The term "location-based touch input" refers to any touch input that involves a change in a detected location and/or area of the touch input on a touch sensor, as well as a presence and/or absence of touch in a particular region of the touch sensor, and may include gestures, changes in touch area, etc. In some embodiments, the touch-detection mechanism may be configured to detect multiple temporally overlapping touches (i.e. "multi-touch"), thereby allowing the detection of multi-finger gestures made on the mouse surface. Further, embodiments are disclosed herein that relate to the construction of a touch sensor that may be used on non-planar surfaces, including but not limited to the curved surface of a computer mouse. These embodiments are described in more detail below.

Figure 1:
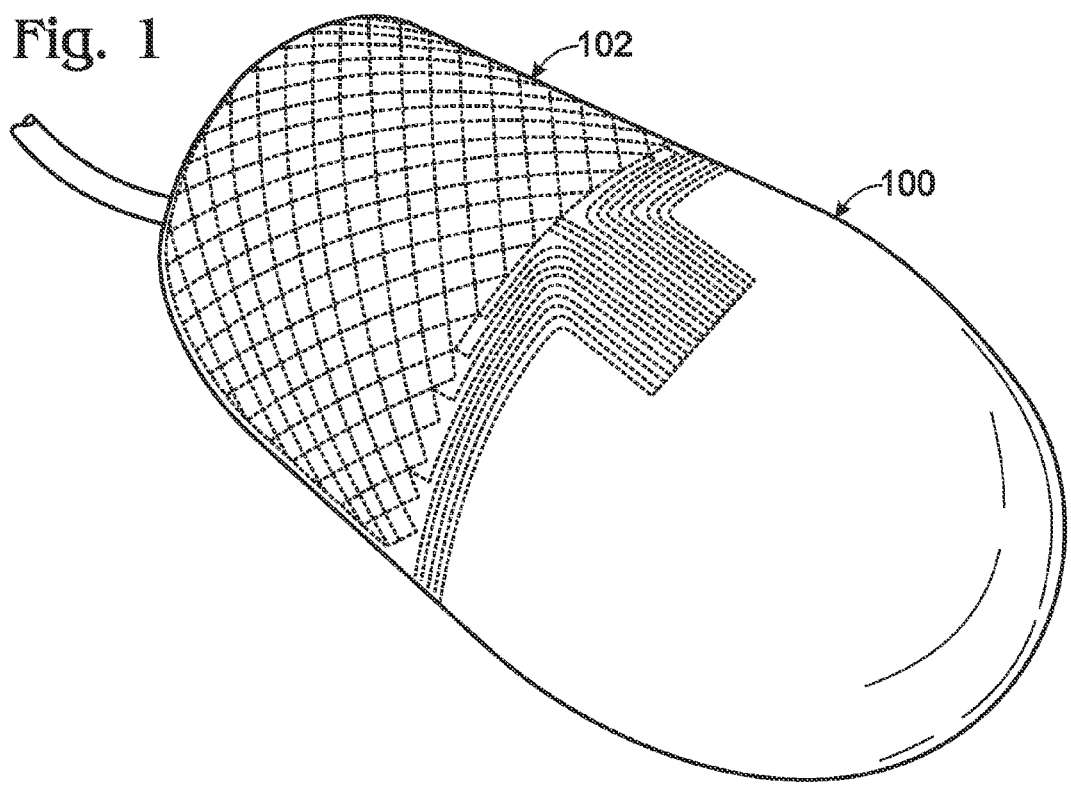
FIG. 1 shows an embodiment of a mouse comprising a touch sensor.

FIG. 1 shows an embodiment of a computer mouse 100 comprising a touch sensor 102 that extends over a curved geometric feature in the form of a front portion of a body of the computer mouse 100 (i.e. a portion of the mouse configured to be contacted by a user's fingers during ordinary use). The depicted touch sensor 102 extends substantially an entire side-to-side curvature of a top surface of the computer mouse 100, and may be located on an inside surface of the body, outside surface of the body, and/or incorporated into the body. The touch sensor 102 is configured to detect a position of one or more touches on the touch sensor 102. In this manner, the touch sensor 102 may allow a movement of a touch input on the sensor to be tracked, thereby allowing the detection of gesture-based touch inputs. It will be understood that the specific configuration and location of the touch sensor 102 shown in FIG. 1 is presented for the purpose of example, and is not intended to be limiting in any manner, as a touch sensor or touch sensors may be provided at any desired location on a computer mouse. For example, in some embodiments, a touch sensor may cover substantially an entire surface of a computer mouse. In other embodiments, in some embodiments, a touch sensor may extend along a portion of the side-to-side curvature of a computer mouse. In yet other embodiments, separate touch sensors may be used at different locations on the surface of the computer mouse. In still other embodiments, other input devices than computer mice may have curved geometric features with touch-sensing capabilities.

Figure 2:
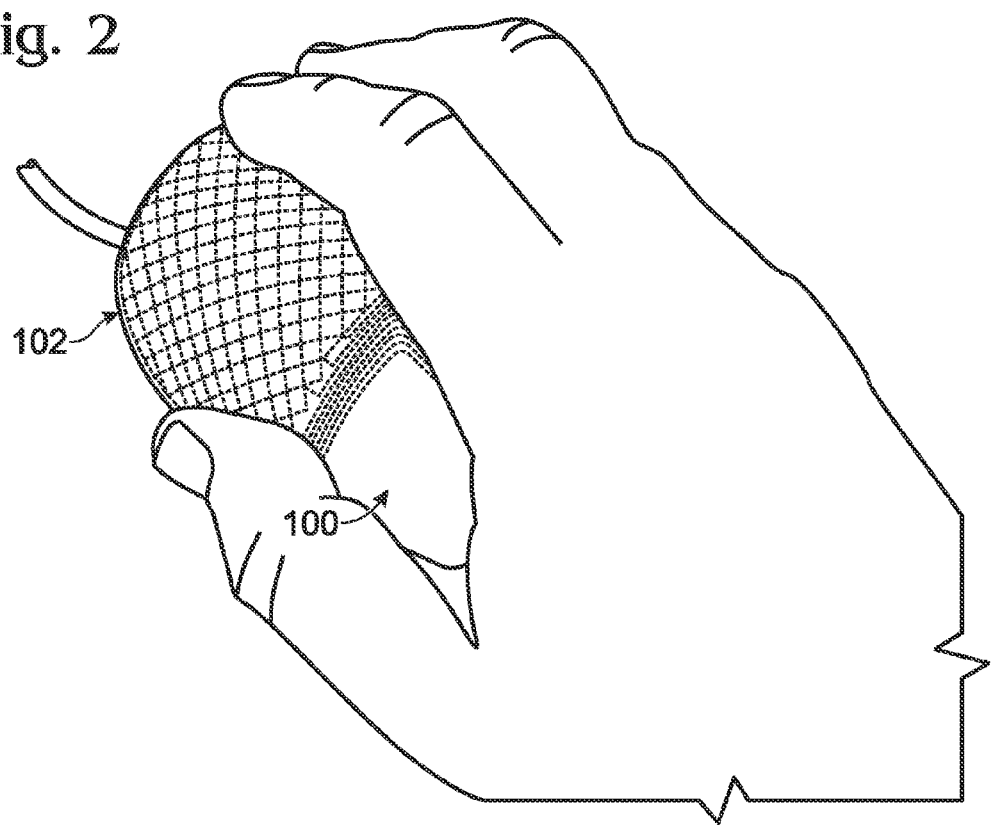
FIG. 2 depicts a user holding the embodiment of FIG. 1.
Figure 3:
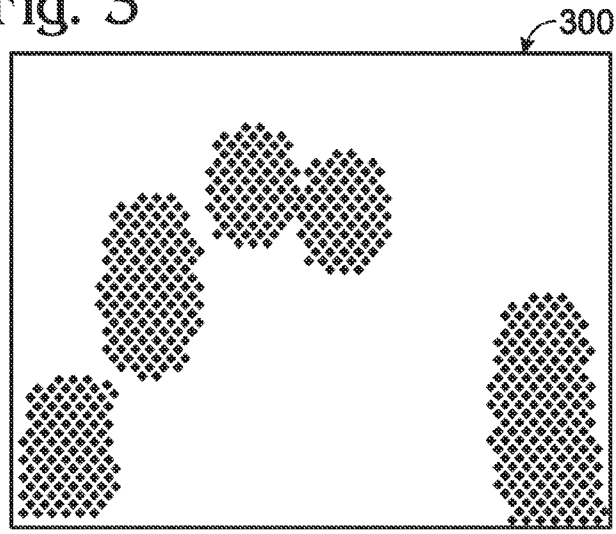
FIG. 3 depicts a schematic representation of a signal detected by the touch sensor of the embodiment of FIG. 1 when held as depicted in FIG. 2.

FIG. 2 depicts a user gripping the computer mouse 100 of FIG. 1, and FIG. 3 shows a resulting signal 300 detected by the touch sensor 102 of the user's fingers contacting the computer mouse 100. As can be seen in FIG. 3, a location and area of each of the user's fingers on the touch sensor 102 is detected by the touch sensor. Therefore, by periodically sampling the output from the touch sensor 102 at a suitable rate, motion of each of the user's fingers on the touch sensor 102 may be tracked. Such motion may then be compared to expected motions that define recognized touch gestures to determine whether the user has made a touch gesture input. While FIG. 3 depicts the output of a multi-touch sensor, it will be understood that other embodiments may utilize a touch sensor configured to detect single touches. Further, in other embodiments, a touch sensor may be configured to detect near-touches (i.e. where a finger is held in close proximity to, but not in direct contact with, the touch sensor). This may allow a "near-touch" state to be recognized and implemented in associated software. Further, a difference between a "near-touch" state and a "touch" state may be determined, for example, via differences in the measured intensity of a signal at the location of the touch/hover, and/or from the presence or absence of a pressure signal from a pressure sensor when a touch signal is detected from a capacitive touch sensor.

As mentioned above, the depicted touch sensor 102 may allow the detection of touch locations (and potentially area), as opposed to a mere presence/absence of touch. Therefore, in addition to allowing the detection of static hand and finger positions, the touch sensor 102 allows the detection of touch gestures. The term "gesture" as used herein denotes a movement of one or more fingers for the purpose of communicating an intent to the system. Various types of gestures may be utilized. For example, some embodiments may recognize momentary gestures and continuous gestures. Momentary gestures may comprise gestures that are performed in a beginning-to-end fashion such that the gesture is recognized upon completion of the gesture (e.g. upon completing motion and lifting a finger from the touch sensor). One example of such momentary gestures is a flick gesture (e.g. a quick linear movement of one or more fingers across the touch sensor) configured to cause scrolling of a list, navigation through a browser history, etc. Momentary gestures also may comprise motion in multiple directions, for example, along multiple lines and/or curved paths. For example, a user may draw an editor's insertion mark (" ˅ ") to paste copied text at a current cursor location in a text selection. It will be understood that these examples of momentary gestures are presented for the purpose of example, and are not intended to be limiting in any manner.

Continuous gestures, as opposed to momentary gestures, comprise gestures that allow a user to specify one or more parameters continuously, and with on-display feedback, until the user's intent has been achieved. One example of a continuous gesture is a "pinch" gesture, in which a change in distance between two fingers on a multi-touch sensor may be used as input to make a corresponding reduction size of a photograph or other object being manipulated, a change in a pitch of a sound emitted by the computing device, etc (or other suitable audio feedback). Likewise, a "stretch" gesture, in which a distance between two fingers on a multi-touch sensor is increased, may be used to make a corresponding increase in size of a photograph or other object. Other examples of continuous gestures include, but are not limited to, scrolling a list by dragging a finger over the list in a direction of scrolling, rotating an object by changing an orientation of two fingers relative to one another over the object, etc.

Whether a gesture is continuous, momentary, or other gesture type, the touch sensor 102 on the depicted computer mouse 100 provides the benefit of allowing a user to perform gesture-based inputs without having to lift a hand from the computer mouse 100 to move it to a keyboard, touch-sensitive display, or other such input device.

Computer mouse 100 may offer various advantages over the use of a touch-sensitive display to make touch inputs, as computer mouse 100 allows many of the benefits of a touch-sensitive input device to be maintained while avoiding various problems with touch-sensitive displays. For example, touch-sensitive displays used as monitors for computing devices often comprise a vertically-oriented display screen configured to face a user seated in front of the display. While such touch-sensitive displays offer the benefit of direct correspondence between a user's fingers and a graphical object being manipulated on the touch-sensitive display, interaction with such touch-sensitive displays may involve a much larger amount of physical effort than mouse-based interaction. For example, extended use of a vertically-oriented touch-sensitive display may cause significant fatigue in the arm used to make touch inputs.

In contrast, computer mouse 100 allows a user to move a locus of interaction (e.g. cursor, pointer, etc.) across large on-screen distances with little effort, and also allows touch input gestures to be performed at that locus while maintaining hand contact with the computer mouse 100. Further, the incremental cost of adding a touch sensor to a computer mouse may be less expensive than the incremental cost of adding a touch sensor to a display device, as simpler manufacturing processes (e.g. conductive ink printing vs. indium tin oxide deposition) and less expensive materials may be used to manufacture a touch sensor for a mouse than for a display device. Additionally, a touch sensor for a computer mouse may be significantly smaller than a touch sensor for a display device, which may help to further reduce the manufacturing costs of a touch sensor for a computer mouse compared to one for a display device.

Figure 4:
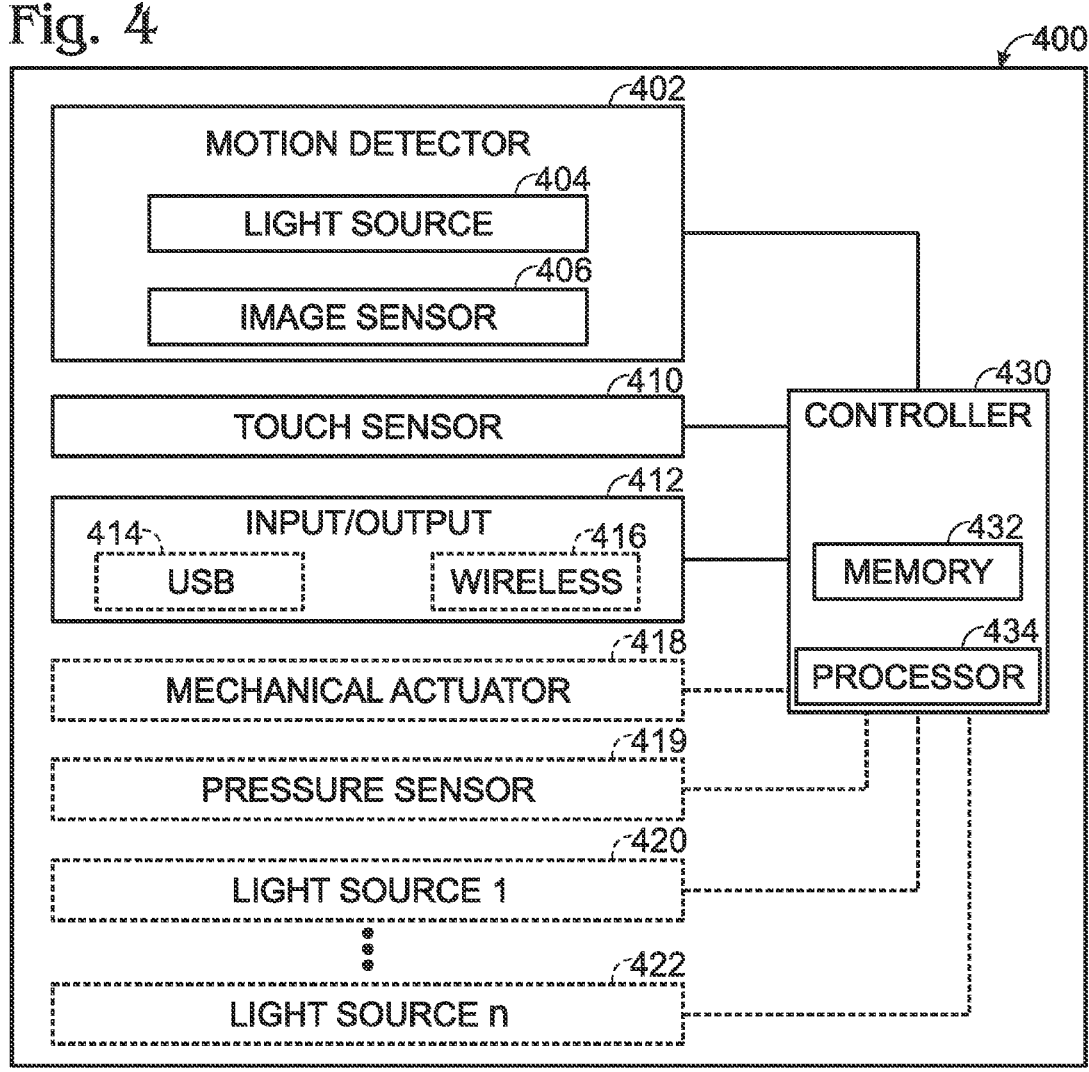
FIG. 4 shows a block diagram of an embodiment of a mouse comprising a touch-sensitive surface.

FIG. 4 shows a block diagram of an embodiment of a computer mouse 400 that incorporates features of the various embodiments described herein, including but not limited to computer mouse 100. Computer mouse 400 comprises a motion detector 402 that allows the computer mouse 400 to track motion on a tracking surface, such as a mouse pad, table, etc. The depicted motion detector 402 includes a light source 404, such as a laser or light emitting diode, configured to emit light toward the tracking surface, and also an image sensor 406 configured to receive light reflected from the tracking surface to periodically acquire images of the tracking surface for the detection of motion.

Computer mouse 400 further comprises a touch sensor 410 disposed on a surface of the computer mouse 400 that is contacted by a user's fingers during ordinary use. In some embodiments, computer mouse 400 may comprise a single capacitive multi-touch sensor, while in other embodiments, computer mouse 400 may comprise more than one touch sensor disposed at various locations on the computer mouse surface. In some embodiments, the touch sensor 410 may comprise a capacitive touch sensor, while in other embodiments, the touch sensor may comprise a resistive or other suitable touch sensor. Furthermore, in some embodiments, the touch sensor may be configured to detect multiple temporally overlapping touches, while in other embodiments, the touch sensor may be configured to detect single touches.

Next, computer mouse 400 includes an input/output system 412 to allow communication with a computing device. Examples of suitable input/output systems include, but are not limited to, a USB interface 414 and/or a wireless communications system 416 that enables wireless transfer of information via a suitable protocol such as Bluetooth, etc.

In some embodiments, computer mouse 400 may optionally comprise one or more mechanical buttons, as shown by mechanical actuator 418. As explained in more detail below, computer mouse 400 may be configured to map touches, gestures, hand postures, and the like, used in conjunction with a mechanical actuation, to specific mouse functions, including but not limited to conventional mouse actions such as "right click". While the depicted embodiment includes a single mechanical actuator, it will be understood that other embodiments may include multiple mechanical actuators. For example, in one embodiments, a mouse may include left and right mechanical buttons (like a conventional mouse), where each button comprises a touch sensor capable of detecting touch inputs made on the surface of the button.

In yet other embodiments, other detection and feedback mechanisms may be provided in addition to, or in place of, a mechanical actuator. For example, regarding feedback mechanisms, a mouse may be configured to vibrate in response to detecting a selected input (e.g. a touch input corresponding to a right click functionality). Furthermore, a mouse may include an audio output such that the mouse can produce a "clicking" sound upon the detection of a right click or other such input. Further, the controller may be configured to output a signal that is configured to trigger audio feedback from a computing device connected to the mouse in response to a selected touch input. It will be understood that these feedback mechanisms are presented for the purpose of example, and are not intended to be limiting in any manner.

Likewise, regarding detection mechanisms, instead of or in addition to a mechanical actuator, a mouse also may include one or more pressure sensors 419, such as a resistive pressure sensor. For example, such a pressure sensor may be positioned on an inner surface of the body of the mouse. When a user pushes against the mouse body (for example, to make a "right click" input), the pressure sensor may detect this pushing, for example, via a slight deformation of the mouse surface. This, along with the input from the touch sensor, may be used to distinguish different actions such as "right click", etc.

Continuing with FIG. 4, in some embodiments, computer mouse 400 may optionally comprise one or more light sources, illustrated as "light source 1" 420 and "light source n" 422, where n is an integer having a value of zero or more. As described in more detail below, light sources 420, 422 may be used to delineate specific regions of touch sensor 410 when the regions are mapped to specific functions. For example, when computer mouse 400 is being used to scroll through a list, a portion of touch sensor 410 may be mapped to have the specific function of a scroll wheel. The portion of touch sensor 410 mapped to the scroll wheel function may then be delineated by activating a corresponding light source 420, 422 to highlight the region, for example, by outlining the region, by illuminating an entirety of the region, or in any other suitable manner.

Continuing with FIG. 4, computer mouse 400 comprises a controller 430 having memory 432 and various logic components, represented by processor 434. Memory 432 may comprise computer-readable instructions stored thereon that are executable by processor 434 to enable the operation of computer mouse 400. For example, the instructions may be executable to receive input from the motion detector 402, touch sensor 410, and mechanical actuator 418, to process these signals, and to provide corresponding control signals to light sources 420, 422, and to a computing device for interaction with a graphical user interface.

In some embodiments, the instructions are executable by processor 434 to provide control signals that are recognizable by a conventional mouse driver running on a computing device. In this manner, computer mouse 400 may be used in conjunction with computing devices running legacy mouse drivers, thereby providing for the backward compatibility of computer mouse 400. As a more specific example, where a portion of touch sensor 410 is mapped to a scroll wheel functionality, touch signals received at the mapped portion of touch sensor 410 may be converted to conventional scroll wheel signals that are provided to the computing device. Likewise, an actuation of mechanical actuator 418 and/or pressure sensor 419 that is determined to be a "left click" or a "right click" (e.g. a pressing of a conventional left or right mouse button) via signals from touch sensor 410 may be converted to conventional "left click" or "right click" signals as provided by a conventional mouse. It will be understood that these examples of the conversion of signals from touch sensor 410, mechanical actuator 418, and/or pressure sensor 419 to conventional mouse signals are presented for the purpose of example, and are not intended to be limiting in any manner.

Figure 5:
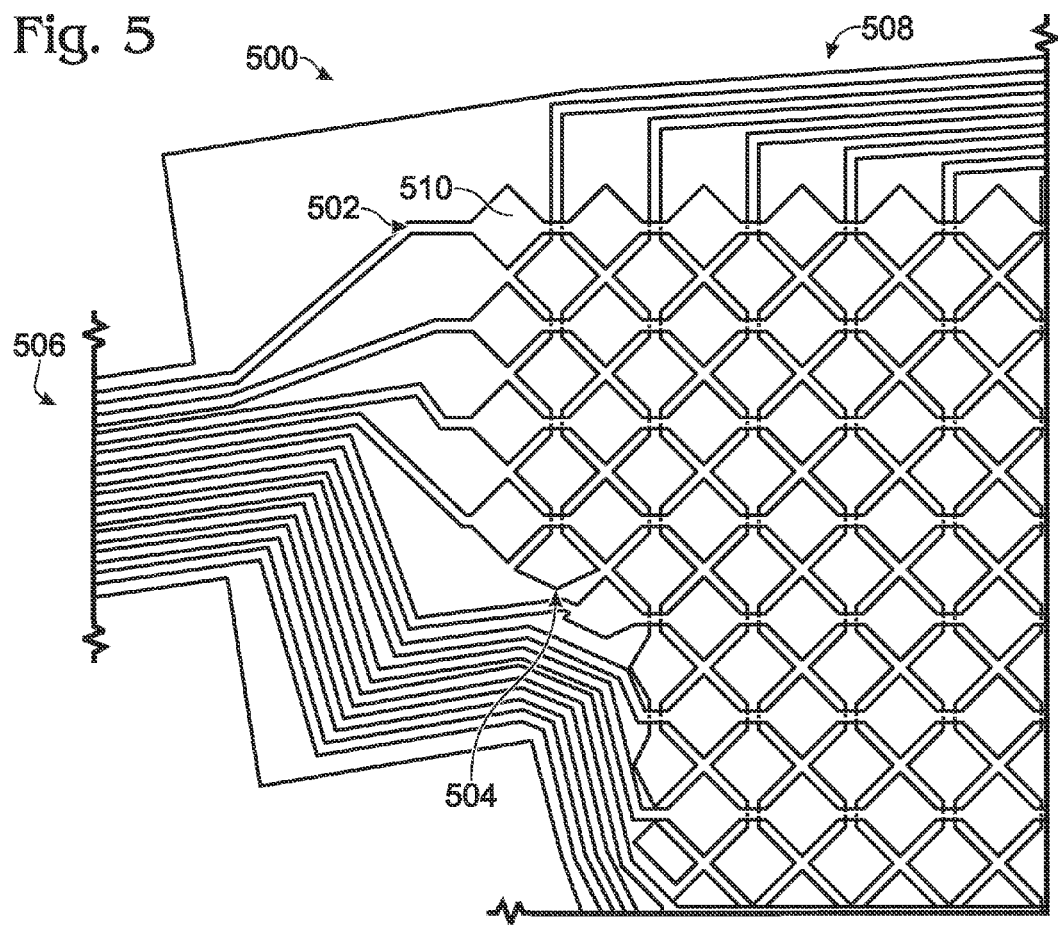
FIG. 5 shows an embodiment of a sensor element layout for a capacitive touch sensing mechanism.

The capacitive touch sensor 410 may have any suitable configuration to detect touch via capacitance. FIG. 5 shows an example of one suitable configuration 500 for capacitive touch sensor 410 that comprises a plurality of rows of sensor elements, one example of which is indicated at 502, and a plurality of columns of sensor elements, one example of which is indicated at 504, that together form a plurality of pixels each being configured to detect touch at a location on the body over the pixel. The rows of sensor elements 502 are separated from the columns of sensor elements 504 via a dielectric layer. A first plurality of leads 506 connect the rows of sensor elements 502 to a power supply and/or ground (at an opposite end of the row, not shown), and second plurality of leads 508 connect the columns of sensor elements 504 to a power supply and/or ground (at an opposite end of the column, not shown). In the depicted embodiment, each sensor element, one of which is indicated at 510, has a rectangular shape that is connected with adjacent sensor elements in the same row or column at opposite corners. However, it will be appreciated that a sensor element may have any other suitable shape than that shown.

Figure 6:
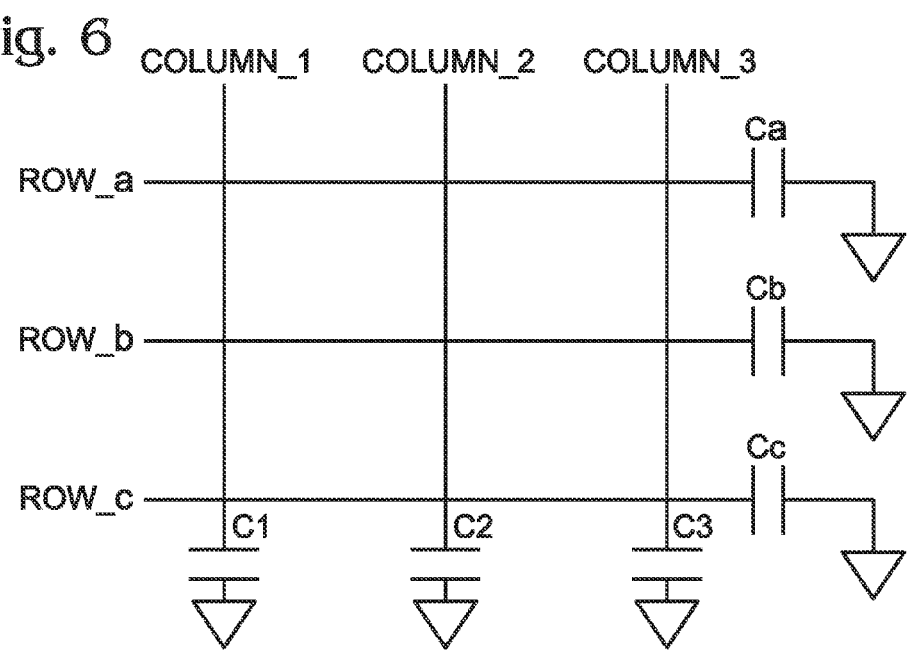
FIG. 6 shows an embodiment of a capacitive touch-sensing circuit configuration.

Any suitable circuitry may be used to detect touch via touch sensor 410. Human flesh is somewhat electrically conductive, and humans are typically in good contact with electrical ground through their surroundings. The capacitance from a user's fingers to ground is typically around 1000 picofarads. The effect of this capacitance on the measured capacitance of a location of touch sensor 410 in contact with or proximity to a user's finger may be measured in various ways. For example, in some embodiments, the capacitance from a sensor element 510 to ground may be measured, as shown in FIG. 6. As a user approaches and touches the sensor element, the capacitance to ground of that sensor element will increase. Information regarding changes in capacitance of rows and columns allow the touch to be mapped to a region of the sensor corresponding to an intersection between the affected row and affected column.

Figure 7:
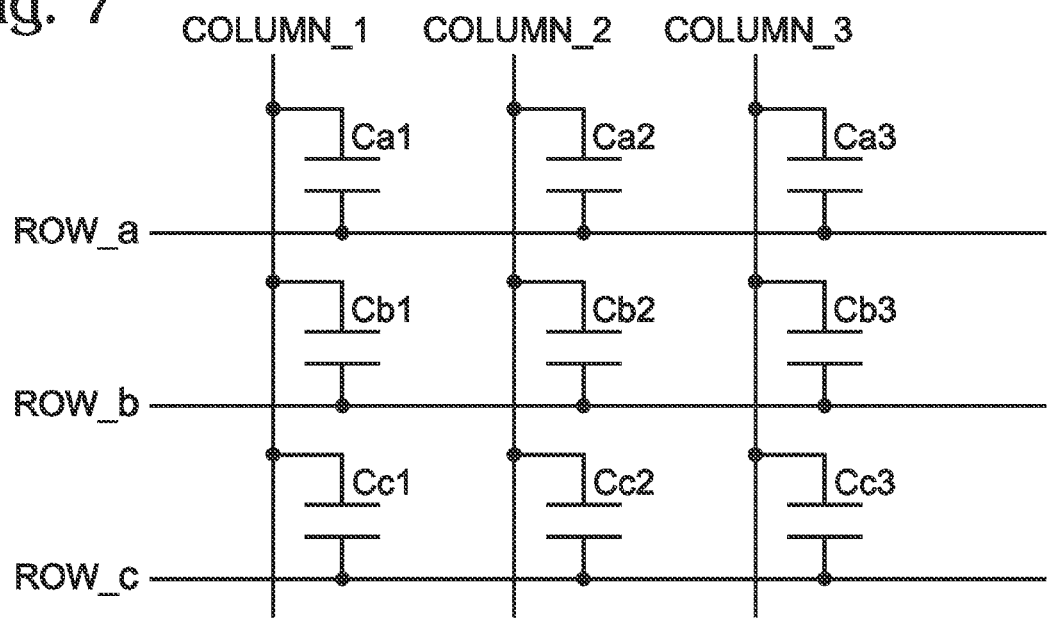
FIG. 7 shows an embodiment of another capacitive touch-sensing circuit configuration.

In other embodiments, capacitance may be measured by measuring between row sensor elements and column sensor elements, as shown in FIG. 7. As a user gets close to the boundary between sensor elements, the user's capacitance to ground disrupts the field at that location, and the measured capacitance between the sensor elements decreases.

Figure 8:
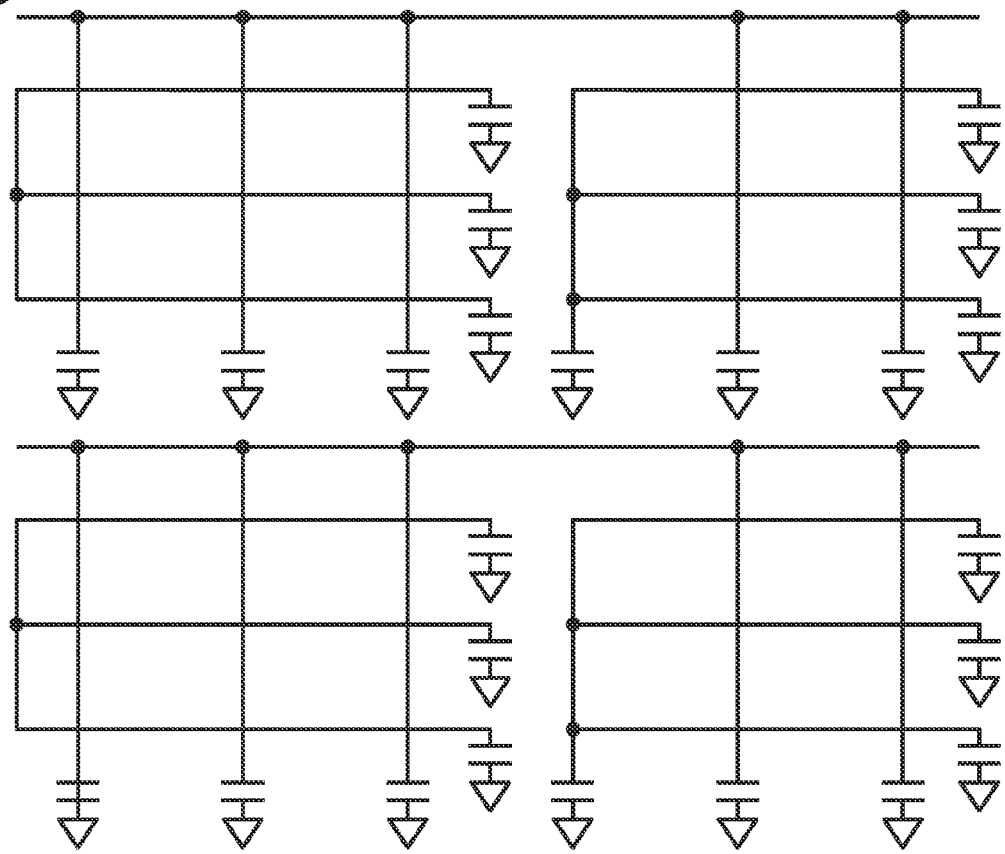
FIG. 8 shows an embodiment of another capacitive touch-sensing circuit configuration.

In yet other embodiments, the capacitance may be measured from sensor element to ground, as described above for FIG. 6, but using sensor elements that extend part of a column and/or part of a row. This is illustrated in FIG. 8. In this manner, a location of a touch may be more precisely determined along the length of a row 800 and/or a length of a column 802. In the depicted embodiment, each row 800 and each column 802 has two connections to ground, but it will be understood that each row and/or each column may have any suitable number of connections to ground. The use fewer sensor elements between a power supply and ground may allow for more precise determination of touch location, for a given sensor size. In yet other embodiments, each sensor "pixel" may comprise an individual capacitance circuit with its own connection to a power supply and to ground.

Referring briefly back to FIG. 5, the capacitive sensor elements 510 may have any suitable spacing. For example, in some embodiments, the sensor elements 510 have a spacing of approximately 1-5 millimeters between the centers of adjacent sensor elements. Sensor elements of this size are sufficiently small that a finger touching the touch sensor will be in range of at least two sensor elements, as an adult index finger has a touch area of very roughly 10 mm in diameter when touching a touch sensor. With such a sensor, it will be appreciated that a useful resolution may be finer than the sensor size, as a more precise position may be interpolated when a finger covers multiple sensor elements. In other embodiments, the sensor elements may have a finer spacing than 5 mm. However, this may increase a cost of the touch sensor, as the number of rows and columns may increase. Likewise, in some embodiments, the sensor elements may have a larger spacing than 5 mm. However, in this case, the sensors may be sufficiently large that a finger may touch a single sensor element, which may make it difficult to determine the position of a finger, and therefore may result in degradation of sensor resolution.

Any suitable sensor size and number of sensor elements 510 may be used. For example, in some embodiments, a sensor area of approximately 100 mm×50 mm may be used. In the embodiment of FIG. 6, such a sensor having m×n rows may have a number of columns and rows equal to m+n, and m+n capacitance measurements yield a full readout of the sensor. However, in this embodiment, if a user is touching multiple rows and/or multiple columns at one time, some ambiguity may exist about the location of the touch. For example, if the user is touching rows A and B and columns 2 and 3, then it may be difficult to determine whether the user is touching at positions (A, 2) and (B, 3), or at positions (A, 3) and (B, 2). As described in the context of FIG. 8, this ambiguity may be overcome to some degree by the use of multiple connections to ground in each row and/or each column of sensor elements.

In contrast, and referring again to FIG. 7, if the capacitance from one sensor element to another sensor element is touched, then m×n measurements may be made, as the capacitance may be measured from each row to each column. In this case, it is possible to resolve each touch location independently where a touch occurs over multiple columns and/or multiple rows.

The use of an m×n measurement embodiment may offer advantages over the use of an m+n measurement embodiment in some situations. For example, multiple accidental touches are likely as the user grips the computer mouse during use. Due to the ambiguities of determining a precise location of a touch input with the m+n method described above, heuristics to discard such extraneous touches may be more difficult to develop for the m+n method compared to the m×n method, as the m×n can resolve the capacitance at each sensor element independently.

On the other hand, the m+n method may offer other advantages, since it potentially may be implemented at lower cost and power. To improve the ability to unambiguously locate touches with the m+n method, the embodiment of FIG. 8 may be used. This embodiment may allow the measure of two independent touch points, as long as one was to one side of a split in a row or column, and the other was to the other side.

In yet other embodiments, a sensor may utilize both m+n and m×n detection methods. For example, the m×n measurement, while offering more detail, also may consume more device power due to the greater number of measurements made. Therefore, a sensor may be read using an m+n detection method until a change in touch state is detected. Then, an m×n measurement may be performed to gather more detailed information about the changed touch state, before resuming m+n measurements. This is described in more detail below in the context of FIG. 24.

Touch sensor 410 may be constructed in any suitable manner and from any suitable materials. For example, conventional capacitive touch sensors for touch-sensitive display devices may be made from a transparent conductor, such as indium tin oxide (ITO), deposited on an insulating glass or plastic substrate. Such a sensor may be formed, for example, by forming rows on a front face of a substrate, and columns on a back face of a substrate (or vice versa), or from a single layer of ITO that comprises both columns and rows, with metal or ITO jumpers.

However, in the case of a touch-sensitive computer mouse or other such use environment for a touch sensor, a sensor may be non-transparent. Further, a touch sensor for a computer mouse has a curved surface, as opposed to a touch sensor used for a touch-sensitive display. Therefore, a capacitive touch sensor for a computer mouse may be manufactured through other processes. For example, in one embodiment, a curved capacitive touch sensor may be made by printing (e.g. screen printing, ink jet printing, or other suitable printing technique) the columns and rows of the touch sensor onto a flexible insulating substrate using a conductive ink. As a more specific example, a silver polymer thick film may be printed onto a polyester substrate. It will be understood that this example is presented for the purpose of illustration, and is not intended to be limiting in any manner.

FIG. 9 illustrates an embodiment of a method 900 for forming an object with a curved geometric feature having a capacitive multi-touch sensor. While shown in the context of a computer mouse, it will be understood that the concepts may be applied to any other suitable curved object. First, method 90 comprises, at 902, forming a first set of sensor elements on a first side of a flexible insulating substrate. As indicated at 904, in one more specific embodiment, the first set of sensor elements may be formed by printing a conductive ink onto the flexible substrate as a thick film. Contact traces may be formed in the same manner. Next, method 900 comprises, at 906, forming a second set of sensor elements on a second side of the substrate. As indicated at 908, in one more specific embodiment, the second set of sensor elements may be formed by printing a conductive ink onto the second side of the substrate, thereby forming the sensor. Contact traces may again be formed in the same manner. Next, the sensor may be bent over the curved mouse surface, as indicated at 910, and then fixed to the mouse surface (e.g. via an adhesive or other suitable mechanism), as indicated at 912 to form the touch-sensitive computer mouse. It will be understood that any electrical connections of the sensor to a power supply, controller, etc. may be made in any suitable manner. For example, the substrate may include a flexible "tail" onto which traces are printed, and which may be routed into the mouse interior to connect to other circuitry.

FIG. 10 shows another embodiment of a method for forming a computer mouse with a capacitive multi-touch sensor. Method 10 comprises, at 1002, forming a first set of sensor elements (and traces) on a first side of the substrate, e.g. by printing, and then, at 1004, forming a dielectric layer over the first set of sensor elements. Next, method 1000 comprises, at 1006, forming a second set of sensor elements (and traces) over the dielectric layer to form the sensor. Then, at 1008, method 1000 comprises bending the sensor over the surface of the mouse, and then fixing the sensor to the mouse surface to form the touch-sensitive computer mouse.

Figure 21:
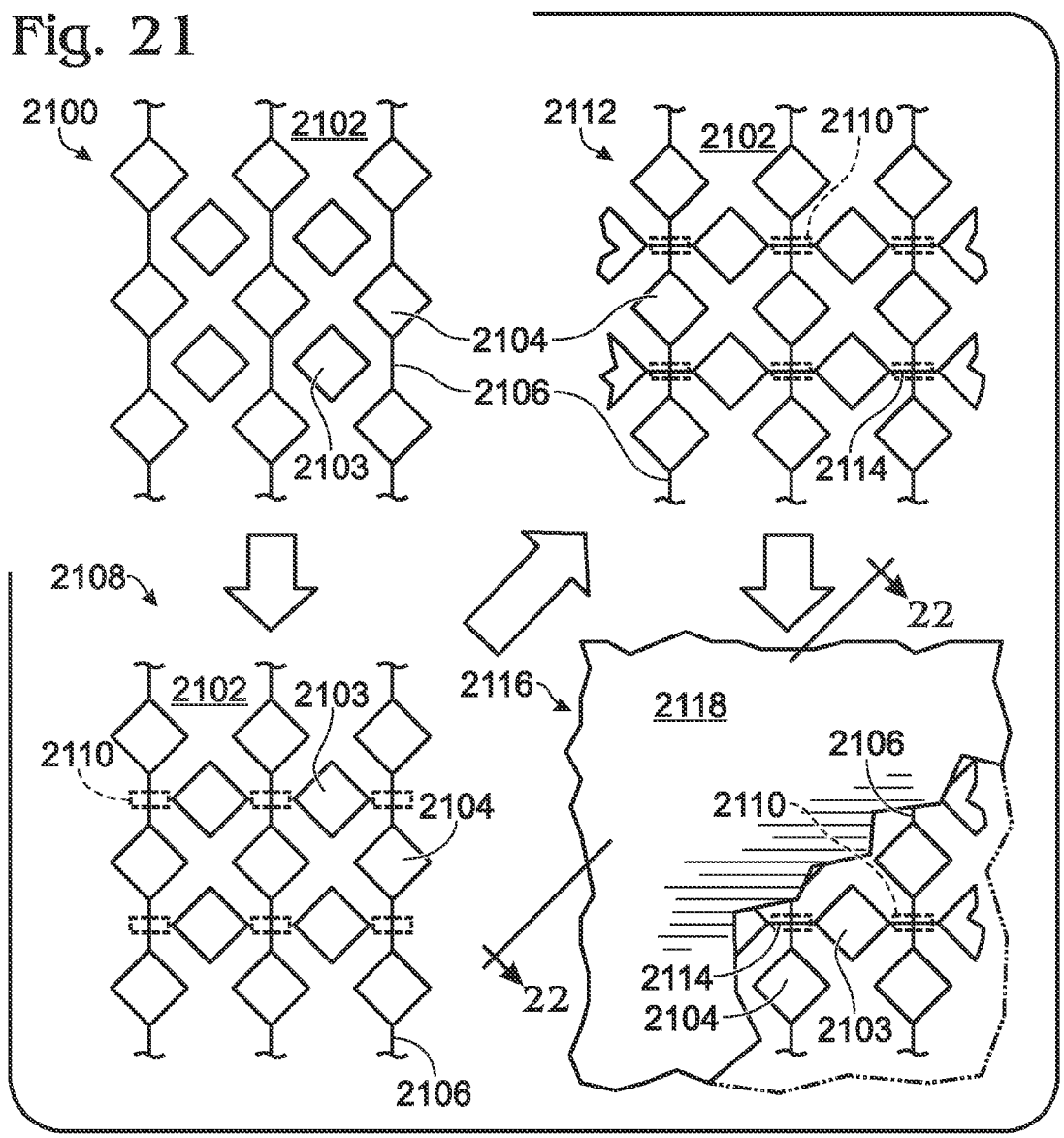
FIG. 21 shows embodiments of a capacitive touch sensor and a piezoresistive pressure sensor that share a common electrode array.

FIG. 11 shows another embodiment of a method 1100 of forming a multi-touch sensor for a computer mouse. First, at 1102, first and second sets of sensor elements are printed in a single layer, wherein connectors are formed for the first set of sensors. Next, at 1104, an insulating material is deposited in regions where jumpers will be formed, i.e. over the connectors for the first set of sensors. Then, at 1106, conductive jumpers are deposited over the insulating material to form connectors for the second set of sensors to complete the sensor. This process is illustrated in FIG. 21, described below. The sensor then may be fixed to a computer mouse, as described above. It will be understood that these embodiments are presented for the purpose of example, and are not intended to be limiting in any manner.

Any suitable substrate may be used as a substrate for printing conductive inks. One example of a suitable substrate comprises a polyester sheet having a thickness of approximately 0.003 inches. In other embodiments, the substrate may be made of any other suitable flexible insulating material, and may have any other suitable thickness. Likewise, the conductive ink may have any suitable thickness. In one specific embodiment, the conductive ink forming each sensor element has a thickness of approximately 0.001 inch. In other embodiments, the conductive ink may have any other suitable thickness.

The electrical properties of the thick polymer conductive ink films in such sensors may have a lower sheet resistance than those of ITO on glass. For example, a thick film of silver ink has a lower sheet resistance (~40 milliohms for silver conductive ink vs. tens or hundreds of ohms for ITO). This may decrease the RC delay along the columns and rows of the sensor, and therefore may permit faster measurements on longer traces with less error. Further, in some embodiments, carbon conductive ink may be used instead of silver ink. Carbon ink may be less expensive than silver ink, and also may have a suitably low resistance.

The methods shown in FIGS. 9-11 are suitable for forming a multi-touch sensor for a "developable surface" of a mouse or other object. The term "developable surface" as used herein refers to a surface that can be flattened to a plane without distortion (e.g. compression and/or stretching). FIG. 12 shows an example embodiment of a computer mouse 1200 with such a developable surface. Specifically, the developable surface extends from a left edge of the computer mouse (referring to the orientation of the computer mouse in FIG. 12), along a long axis of the mouse to a location (indicated by dashed line 1202) where the mouse begins to curve downwardly toward the right bottom edge. A touch sensor applied to this portion of mouse 1200 is in a location that is touched by a user's fingers during normal use, and therefore can detect touch gestures made by a user's fingers.

In other embodiments, a computer mouse may comprise a touch sensor located on a non-developable surface with complex curvature. FIG. 13 shows an embodiment of a method 1300 for forming a computer mouse with a multi-touch sensor for use on a non-developable surface, wherein the method comprises folding a sensor before application to a non-developable surface. Method 1300 comprises, at 1302, forming first and second sets of sensor elements on a substrate in a region of the substrate that is not to be folded. The first and second sets of sensor elements may be formed as described in any of methods 900-1100 above, or in any other suitable manner.

Next, method 1300 may comprise, at 1304, forming electrical traces in the region of the substrate to be folded. Such traces may be formed, for example, to connect sensor elements that are spatially separated by the region of the substrate to be folded. Method 1300 next comprises, at 1306, folding the substrate into a shape that matches the complex curvature of the mouse surface to which it is to be applied, and then at 1308, fixing the sensor to the mouse surface. In this manner, a substrate that is initially flat during manufacturing may be shaped to fit a non-developable surface. The sensor may then be connected to electronics on a printed circuit board located within the mouse via a flexible "tail" that is also printed using conductive polymer thick film ink on the flexible plastic substrate. Such a tail may be connected to the printed circuit board using a ZIF or other flex connector, or simply by pressing it against contacts on the board.

It will be understood that, in addition to folding the substrate, the substrate also may be cut in order to allow it to be folded or otherwise shaped to a non-developable surface. However, in some use environments, folding may be more practical than cutting, as electrical connectivity may be maintained in a folded region as compared to a cut region. It likewise will be understood that polymer thick film inks may be rated for a sharp crease without flaking or otherwise failing to maintain contact across a fold.

FIG. 14 shows another embodiment of a method 1400 for forming a computer mouse with a capacitive multi-touch sensor disposed on a non-developable surface of the computer mouse. Method 144 comprises, at 1402, forming a first set of sensor elements directly on a surface of the computer mouse. The first set of sensor elements may be formed, for example, by pad printing conductive ink onto the surface of the computer mouse, as indicated at 1404. Pad printing is a process where a pattern is first printed onto a flexible pad, and then the flexible pad is pressed against another surface to transfer the pattern to that surface. In some embodiments, the conductive ink may be printed onto an inside surface of the mouse body, as indicated at 1406, while in other embodiments, the conductive ink may be printed onto an outside surface of the mouse body, as indicated at 1408. Where the conductive ink is printed on the inside surface of the mouse body, the mouse body may be sufficiently thin (e.g. approximately 0.5 mm) for the effect of a finger touching the mouse body to be detectable by the sensor.

Continuing with FIG. 14, method 1400 next comprises, at 1410, forming a dielectric layer over the first set of sensor elements, and then at 1412, forming a second set of sensor elements over the first set of sensor elements. In other embodiments, the first and second sets of sensor elements may be formed on an inside surface and an outside surface of a mouse body, respectively.

Force may additionally and/or alternatively be measured by using piezoresistive ink. For example, a layer of piezoresistive ink may be inserted between rows and columns of the sensor that are constructed on different substrates. In such an arrangement, the current may then flow normal to the plane of the sensor. As another example, a layer of piezoresistive ink may be stacked on top of the sensor when the rows and columns of the sensor are constructed on the same substrate (with jumpers to connect the rows and columns in a matrix). In such an arrangement, the current may flow within the plane of the sensor. The impedance between a row and a column is thought to be the parallel combination of the resistance and capacitance. By measuring at two separated frequencies, the capacitance and resistance may be measured independently. This is described in more detail below in the context of FIGS. 21-23.

Next, method 1400 comprises at 1414, forming a protective layer over the second set of sensor elements. Such a protective layer may be formed, for example, by applying a dielectric paint over the second set of sensor elements, as indicated at 1416, by applying a thin pre-molded shell over the second set of sensor elements, as indicated at 1418, or via any other suitable process. In this manner, a capacitive multi-touch sensor may be formed directly on a mouse body, instead of on a substrate that is subsequently fixed to the mouse body. Interconnects for such an embodiment may be formed in any suitable manner. One example of a suitable method of forming interconnects to this sensor may comprise using a conforming material with anisotropic conductivity, similar to the "zebra stripe" material used on some liquid crystal displays, to form the interconnects.

FIG. 15 shows another embodiment of a method 1500 for forming a capacitive multi-touch sensor on a non-developable surface of a computer mouse via a so-called "in-mold decoration" process. Method 1500 comprises, at 1502, forming a "foil", and then, at 1504, printing first and second sets of sensor elements on the foil. The foil is an insert that is to be placed in a mold during a mouse body molding process in such a manner that a pattern printed on the foil is transferred to the molded article during molding. Thus, method 1500 next comprises, at 1506, inserting the foil, with the first and second sets of sensor elements printed thereon, into the mold, and, at 1508, molding the mouse body in the mold, thereby transferring the pattern to the mouse body. The foil may or may not be incorporated into the molded article during molding. Electrical traces may be formed on the mouse body during the molding process in the same manner.

In some embodiments, the conductive material printed onto the mouse surface may be a material that sublimes. In such embodiments, the sensor array may be sublimated into the bulk material of the body of the mouse, thereby incorporating the sensor array directly into the mouse body.

The sensors described above in the context of methods 900, 1000, 1100, 1300, 1400, and 1500 are configured to sense capacitance. This allows the sensor to detect whether or not a human finger is in close proximity to a specified point on the sensor, but does not directly detect the force with which that finger is pressing. As described in more detail below, this force may be measured indirectly, by measuring the contact patch area of a touch input. This area will increase as the finger presses with greater force, due to the flattening of the finger's flesh. In some embodiments, a measurement of force may be obtained by laminating the sensor with a transducer that converts force to electrical capacitance. An example of such a transducer is a material with dielectric constant that is sensitive to pressure, such as a liquid crystal material. It will be understood that this example of a pressure sensor is presented for the purpose of example, and is not intended to be limiting in any manner.

As mentioned above, a mouse with a touch-sensitive surface may comprise one or more light sources that may be selectively illuminated to delineate regions of the touch-sensitive surface that are mapped to specific functions. For example, FIG. 16 shows an embodiment of a computer mouse 1600 that comprises a region 1602 mapped to function as a scroll wheel. A user may scroll a list, for example, by flicking or dragging a finger forward and backward relative to a long axis of computer mouse 1600 along region 1602.

However, because the computer mouse 1600 may have a smooth, featureless surface that otherwise does not indicate this functionality when it is active, the computer mouse 1600 may comprise one or more light sources that may be illuminated to delineate region 1602 when the region is mapped to the scroll wheel function. In the depicted embodiment, a border 1604 of region 1602 is illuminated, but it will be understood that, in other embodiments, the region may be indicated in any other suitable manner. For example, in other embodiments, the entire region 1602 (rather than just a perimeter of the region) may be illuminated. While shown in the context of a region mapped to a scroll wheel functionality, it will be understood that any suitable region of the computer mouse 1600 mapped to any specific functionality may be indicated via a light source in a similar manner.

Any suitable type of light source may be used to illuminate region 1602. For example, in some embodiments one or more light pipes (i.e. total internal reflection light conductors) may be used to transport light from a light emitting diode or other light emitter within the mouse to the mouse surface at a location above the touch sensor. In other embodiments, the light sources may comprise an electrophoretic ink. In yet other embodiments, the light source may be configured to emit light from beneath the touch sensor. In such embodiments, the touch sensor may employ a transparent conductor, such as ITO, that allows the light to pass through the sensor, as opposed to a polymer thick conductive ink film. Alternatively, the touch sensor may be fabricated to leave the regions through which light passes free from any traces or sensor elements to allow light to pass through the sensor.

Specific functionalities may be indicated any other suitable manner than that shown in FIG. 16. For example, in some embodiments, a thin, plastic snap-on cover may be provided that comprises demarcations at specific locations that are mapped to specific functionalities. FIG. 17 shows an example of such a mouse cover 1700, where a centrally disposed demarcation 1702 in the cover 1700 corresponds to a region of the mouse mapped to a scroll wheel function. The mouse cover 1700 may comprise a code that is readable by the mouse to allow the mouse to identify the cover and look up a pre-set touch sensor mapping for that cover. Such a cover may be supplied, for example, with a game or other software to automatically map the touch sensor to functions of the game or other software. In one embodiment, the code comprises one or more conductive elements 1704 that are readable by a mouse touch sensor. In other embodiments, the code may comprise an optically readable code (e.g. bar code) that is readable by an optical detector in the mouse, or any other suitable type of code.

It will be appreciated that any other suitable function or functions may be mapped to specific regions on a mouse touch sensor. For example, as described above, a right side of a computer mouse touch sensor may be mapped to a "right click" functionality, and a left side may be mapped to a "left click" functionality. Further, a two-dimensional panning function may be mapped to a square region of the touch sensor for use while navigating spreadsheets. Additionally, a "scrub" function may be mapped to an annular region of the touch sensor for moving rapidly through a timeline in a video editing application. It will be understood that these specific functionalities are presented for the purpose of example, and are not intended to be limiting in any manner.

Because an association between region and function may be changed arbitrarily in software, the mapping of specific touch sensor regions may be adapted to user preference or current task. For example, novice users of computing devices may be confused by the potentially large number of buttons on a conventional mouse. Therefore, for such a user, a mouse with a single mechanical actuator (such that the entire mouse body acts as a mechanical button) and also a touch sensor could initially act as a simple one button mouse that gains functionality as the user's comfort and experience increases.

In such a single mechanical actuator mouse, an intent for a mechanical actuation to perform a specific function may be determined by a touch input associated with the mechanical actuation. For example, intents to invoke "left click" and "right click" functionalities via the single mechanical actuator may be distinguished via changes in touch inputs on respective right and left sides of the touch sensor.

FIG. 18 shows an embodiment of a method 1800 of distinguishing left and right click intents via touch sensor input. First, at 1802, method 1800 comprises detecting an actuation of the mechanical actuator. Next, at 1804, method 1800 comprises detecting an increase in a contact area of a finger on the mouse. Such an increase may be caused, for example, by a finger initiating a touch on the mouse body, or by a previously placed finger increasing a pressure on the mouse body. When a user increases an amount of pressure with which the user pushes against the mouse with a finger, a contact area of that finger on the touch sensor may increase. FIGS. 19 and 20 illustrate this concept. First referring to FIG. 19, a touch on a left side of a mouse touch sensor is shown in a touch sensor output at 1900, and a touch on a right side of the touch senor is shown at 1902. Next referring to FIG. 20, if the user intends to make a "right click" input, the user may exert more pressure with the right finger to cause actuation of the mechanical actuator. In this case, the contact area of the right side touch 1902 increases.

Continuing with FIG. 18, method 1800 next comprises, at 1806, detecting a location of the finger corresponding to the increase in touch area on the mouse body via the location on the touch sensor, and then at 1808, determining whether that finger was located on an area of the mouse body associated with a specific function. If that touch did not occur in an area of the mouse body associated with a specific function, then method 1800 comprises, at 1810, assigning the mechanical actuation a default functionality. On the other hand, if the touch occurred in an area of the mouse body associated with a specifically mapped functionality, then method 1800 comprises, at 1812, assigning the mechanical actuation the specific functionality mapped to that area.

As mentioned above, some embodiments may comprise a pressure sensor configured to detect a pressure of a touch input against the surface of a mouse. Such touch pressure sensing may allow the computer mouse controller to detect pressure signals that correspond to an actuation of a "left click", "right click", and other such "virtual button" actions that are actuated by mechanical buttons on some mice. Further, touch pressure sensing also may be used to distinguish various actions, such as a "scroll wheel" activation motion on a mouse surface, from incidental touches on the mouse surface by disregarding such inputs when the touch inputs do not meet a predetermined pressure threshold. It will be understood that these examples of uses for pressure sensors in a touch-sensitive mouse are presented for the purpose of example, and are not intended to be limiting in any manner.

Any suitable pressure sensor or arrangement of pressure sensors may be used in a mouse in conjunction with a capacitive multi-touch sensor. For example, in some embodiments, a mouse with a capacitive touch sensor may comprise two pressure sensors—one located at a position configured to detect a "left click" input (i.e. a location on which a left mouse button is commonly found on mechanical mice), and one located at a position configured to detect a "right click" input.

In other embodiments, a pressure sensor may be configured to have a finer resolution such that pressure may be sensed on a pixel-by-pixel basis. Any suitable pressure sensor may be used to determine touch pressure on a pixilated basis. For example, in some embodiments, a piezoresistive sheet (i.e. a sheet comprising a layer of piezoresistive ink) may be used in conjunction with a sensor array to detect touch pressure. Such a piezoresistive sheet is a sheet of a flexible material that comprises a dispersion of small, conductive elements. When pressure is exerted against the sheet, the arrangement of conductive elements is modified. This causes the resistance of the sheet to change in the pressured area. By placing a piezoresistive sheet against a sensor array comprising electrodes with different potentials, resistance of the piezoresistive sheet may be measured between sensor elements to detect a magnitude of pressure exerted against the sheet. It will be understood that other pressure-sensitive variable resistance materials may be used in a similar manner.

Figure 22:
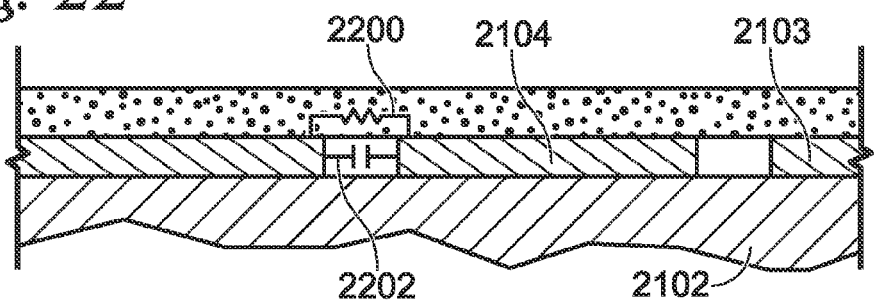
FIG. 22 shows a sectional view of the embodiment of FIG. 21 taken along line 22-22 of FIG. 21.

In some embodiments, separate sensor arrays may be used for a capacitive touch sensor and a resistive pressure sensor. For example, a resistive pressure sensor comprising a piezoresistive sheet and a sensor array may be placed over or under a capacitive touch sensor having a separate sensor array. In other embodiments, a capacitive touch sensor and a resistive pressure sensor may share a common sensor array. FIGS. 21 and 22 illustrate the construction of a capacitive multi-touch sensor and resistive pressure sensor that share a common electrode array. First referring to FIG. 21, a sensor array is formed at 2100 by printing a polymer conductive thick film onto a substrate 2102 in an array of row sensor elements 2103 and column sensor elements 2104. As depicted at 2100, connectors 2106 are initially printed in one direction (depicted as a column direction). Next, as shown at 2108, a dielectric material 2110 is deposited over column connectors 2106, and then at 2112, row connectors 2114 are printed over the dielectric material to complete the sensor array. Finally, at 2116, a piezoresistive sheet 2118 is applied over the sensor. The piezoresistive sheet 2118 is shown in a partially broken away view in FIG. 21 to illustrate the underlying structure.

As shown in FIG. 22, the piezoresistive sheet connects adjacent row sensor elements 2103 and column sensor elements 2104 with a resistive pathway, illustrated schematically at 2200. The capacitive coupling of adjacent sensor elements (in an m×n arrangement) is illustrated schematically at 2202. As such, each sensor element is coupled both resistively and capacitively to neighboring sensor elements. Therefore, resistance and capacitance values may be calculated from impedance measurements taken at different frequencies. In this manner, touch location and touch pressure measurements may be made at a same resolution.

Accordingly, FIG. 23 shows an embodiment of a method 2300 for measuring touch location and touch pressure via a touch sensor that comprises a capacitive multi-touch sensor and a resistive pressure sensor that utilize a single sensor array, such as the embodiment of FIGS. 21-22. Method 2300 comprises, at 2302, acquiring a first impedance measurement, and then, at 2304, acquiring a second impedance measurement at a different frequency. It will be understood that the term "impedance measurement" in this context comprises a complete sensor readout—i.e. an impedance measurement for each pixel of the sensor array.

Next, at 2306, resistance and capacitance values are determined based upon the two measurements made. In some embodiments, as indicated at 2308, the two values may be determined from a magnitude of the total measured impedances. Capacitive reactance and resistance contributions to the magnitude of the total measured impedance are given by the following equation, where |Z| is the magnitude of the total measured impedance and $X_c$ is the capacitive reactance:

$$|Z| = \sqrt{R^2 + X_c^2}, \text{ where}$$

$$X_c = -\frac{1}{2\pi f C}$$

The two impedance measurements may be made at a sufficiently close time interval to allow the assumption that the resistance component of the total impedance is constant in both cases, as well as the capacitance C (i.e. finger pressure and location did not change substantially during the measurement). With these assumptions, the change in total impedance is a function of the frequencies at which the two measurements were made. In this manner, C and R may be determined from the two measurements.

In other embodiments, as shown at 1210, the reactive capacitance and resistance may be determined from a phase angle difference between the two measured impedances. In these embodiments, the following relation may be used to determine the resistance and capacitive reactance:

$$\theta = \arctan\left[\frac{X_C}{R}\right]$$

Again assuming that the two measurements are made during a sufficiently short time interval to assume that R (i.e. touch pressure) and C (i.e. touch location) are constant, the measured phase shift is a function of the reactive capacitance, and therefore of the frequencies at which the measurements were made. In this manner, R and C may be determined from the phase shift.

Continuing with FIG. 23, method 2300 next comprises, at 2312, detecting a touch input from the determined capacitive reactance, and in response, manipulating a graphical user interface in accordance with the touch input. For example, if the detected touch input corresponds to a "pinch" or "stretch" gesture made while a mouse-controlled cursor is located over a photograph object displayed on a graphical user interface, a size of the photograph object may be changed in response to the detected touch input.

Likewise, method 2300 comprises, at 2314, detecting a touch pressure from the determined resistance, and in response, manipulating a graphical user interface in accordance with the pressure. For example, if the detected touch pressure is located within a front-left quadrant of the mouse body, and exceeds a predetermined threshold level of pressure, then that particular touch input may be considered to be a "left click" input. Thus, a user interface action may be taken in response. As a more specific example, where a mouse cursor is located over an icon, detection of a "left click" input may cause a file represented by the icon to be opened and displayed on the user interface.

In some use environments, it may be desirable to detect near-touch events over a mouse body, as well as touches to the mouse body, as detection of a "near-touch" state may enable additional functionalities. With the sensor array embodiment depicted herein in which the array comprises a tiled network of diamond-shaped column and row sensor elements, an m+n capacitance measurement may offer greater sensitivity to near-touches than an m×n capacitance measurement. This is because the m+n capacitance measurement measures capacitance from the sensor element to ground, instead of between the edges of adjacent row and column sensor elements, as done by the m×n measurement. Therefore, the capacitance of each sensor element is greater in the m+n arrangement than in the m×n arrangement, allowing for more sensitivity for detecting near touches.

However, as described above, the m+n measurement offers lower resolution than the m×n measurement, and therefore may result in some ambiguity regarding the location of a touch input, especially where the touch does not at least partially cover both a row and a column sensor element. Therefore, FIG. 24 shows a flow diagram depicting an embodiment of a method 2400 reading a capacitive multi-touch sensor that allows for the increased near-touch sensitivity offered by the m+n measurement method, while also allowing for the higher resolution of the m×n measurement method. Method 2400 comprises, at 2402, measuring an m+n capacitance and determining a touch input signal from the measurement, and then, at 2404, comparing the touch input signal to a previous touch input signal to determine, at 2406 whether any change has occurred between touch input signals. If no change is detected, then method 2400 returns to 2402, where another m+n capacitance measurement is made.

On the other hand, if it is determined at 2406 that a change in touch state occurred between capacitance measurements (for example, a new touch is detected, a current touch is moved or removed, etc.), then method 2400 proceeds to 2408, where an m×n measurement is taken, and a touch input signal is determined from the m+n measurement. Then, method 2400 returns to 2402 such that more m+n measurements are acquired until a change in touch state is again detected. In this manner, sensitivity to near-touch states may be increased relative to the use of m×n measurements exclusively. Further, m+n measurements may consume less power than m×n measurements. Therefore, method 2400 also may help to conserve power, and therefore improve battery lifetime in battery-powered devices.

FIG. 25 shows another embodiment of a method 2500 of making an object, such as a mouse, having a curved, non-developable geometric feature that comprises a capacitive multi-touch surface. Method 2500 comprises, at 2502, forming on a substrate an array of sensor elements defining a plurality of pixels of the multi-touch sensor, and then, at 2504, vacuum forming the substrate into a shaped preform that conforms to a surface of the curved geometric feature of the body of the input device. With the selection of a suitable substrate material, the vacuum forming process allows the substrate and printed array to be formed into a complex, non-developable shape, without the use of any folds and/or cuts in the substrate, as described above. Examples of suitable substrate materials include, but are not limited to, polycarbonate, PET (polyethylene terephthalate), and ABS (acrylonitrile butyldiene, styrene). Likewise, a pressure sensor may be included in the manner described above, wherein a suitable choice of material for supporting the piezoresistive ink may allow the pressure sensor structure to be vacuum molded along with the touch sensor. In some embodiments, forming the pressure sensor may comprise placing a piezoresistive sheet (e.g. a piezoresistive ink supported on a suitable substrate) in contact with the array of sensor elements in the manner described above, either prior to or after forming the preform.

Next, after forming the preform, method 2500 next comprises, at 2506, fixing the preform to the curved geometric feature. In some embodiments, as indicated at 2508, this may comprise placing the preform in a mold, and then introducing a moldable material into the mold to mold the preform into the body of the input device. In other embodiments, as indicated at 2510, the preform may be fixed to the body of the input device after the body of the input device has been created. In this manner, a sensor array may be provided on complex, non-developable surfaces. FIG. 26 shows an example of a mouse 2600 with a sensor array 2602 formed on a non-developable surface having complex curvature.

It will be understood that the embodiments disclosed here may be used with other objects than a computer mouse. For example, a curved touch sensor also may be used with an interactive globe, a curved display, and/or other such curved surfaces. Further, it will be understood that the embodiments disclosed herein may provide a platform for a manufacturer to develop mice of various different functionalities via a single design. For example, where different buttons and other controls are implemented by mouse hardware, each new mouse design may involve the design and manufacture of new molds and other tooling for the new hardware design. In contrast, the inclusion of a touch sensor and/or pressure sensor on a mouse body allows new functionalities to be mapped to specific touch regions of a mouse body, thereby allowing a single hardware design to be used to implement new functionalities.

The various embodiments of computer mice, computer mice functionalities, computer mice manufacturing methods, touch sensor manufacturing methods, and other curved touch-sensitive devices are disclosed for the purpose of example, and are not intended to be limiting in any sense, because numerous variations are possible. The specific routines or methods described herein may represent one or more of any number of processing strategies such as event-driven, interrupt-driven, multi-tasking, multi-threading, and the like. As such, various acts illustrated may be performed in the sequence illustrated, in parallel, or in some cases omitted. Likewise, the order of any of the above-described processes is not necessarily required to achieve the features and/or results of the embodiments described herein, but is provided for ease of illustration and description.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A method of making a multi-touch input device for a computing device, the method comprising:
    forming on one side of a flexible, insulating substrate a first set of sensor elements, the first set of sensor elements defining a plurality of rows of an array of sensor elements;
    forming on the one side of the substrate a second set of sensor elements, the second set of sensor elements defining a plurality of columns of the array of sensor elements, the rows and columns together defining a plurality of pixels of the multi-touch sensor, each pixel configured to detect touch at a location on the multi-touch input device over that pixel;
    forming on the one side of the substrate connectors for the first set of sensor elements;
    forming on the one side of the substrate an insulating layer over the connectors for the first set of sensor elements;
    forming connectors for the second set of sensor elements over the insulating layer; and
    placing a piezoresistive material over the array of sensor elements to form a pressure sensor.

2. The method of claim 1, wherein the multi-touch input device comprises a body having a curved surface, and further comprising forming the substrate into a shape that conforms to the curved surface and fixing the substrate to the curved surface.

3. The method of claim 2, wherein the multi-touch input device comprises a computer mouse, and wherein the curved surface is a body of the computer mouse.

4. The method of claim 2, wherein forming the substrate into the shape that conforms to the curved surface comprises vacuum forming the substrate to form a shaped preform.

5. The method of claim 4, wherein fixing the substrate to the curved surface of the body of the multi-touch input device comprises placing the preform in a mold, and then molding the preform into the body of the multi-touch input device during molding of the body.

6. The method of claim 4, wherein fixing the substrate to the curved surface of the body of the multi-touch input device comprises fixing the preform to the body of the multi-touch input device after forming the body of the multi-touch input device.

7. The method of claim 1, wherein forming the first set of sensor elements and the second set of sensor elements comprises printing the first set of sensor elements and the second set of sensor elements onto a curved surface with a polymer conductive ink.

8. The method of claim 1, wherein forming the first set of sensor elements and the second set of sensor elements comprises printing the first set of sensor elements and the second set of sensor elements onto a curved surface and forming a protective layer over the first set of sensor elements and the second set of sensor elements.

9. The method of claim 8, wherein printing the first set of sensor elements and the second set of sensor elements comprises pad printing the first set of sensor elements and the second set of sensor elements.

10. The method of claim 8, wherein printing the first set of sensor elements and the second set of sensor elements onto the curved surface comprises printing the first set of sensor elements and the second set of sensor elements onto a foil, inserting the foil into a mold, and then transferring the array of sensor elements onto the curved surface during a molding process.

11. The method of claim 8, wherein the first set of sensor elements and the second set of sensor elements are printed with a material that sublimes, and further comprising sublimating the array of sensor elements onto the curved surface.

12. A method of making a multi-touch input device for a computing device, the method comprising:
    forming on a side of a substrate a first set of sensor elements, the first set defining a plurality of rows of a first array of sensor elements;
    forming on the side of the substrate a second set of sensor elements, the second set defining a plurality of columns of the first array of sensor elements, the rows and columns together defining a plurality of pixels of the multi-touch sensor, each pixel configured to detect touch at a location on the multi-touch input device over that pixel;
    forming on the side of the substrate connectors for the first set of sensor elements;
    forming on the side of the substrate an insulating layer over the connectors for the first set of sensor elements;
    forming connectors for the second set of sensor elements over the insulating layer; and
    forming a pressure sensor configured to detect touch pressure over the multi-touch input device by forming a second array of sensor elements, and a piezoresistive material in contact with the second array of sensor elements.

13. The method of claim 12, further comprising forming the substrate into a shape that conforms to a curved surface and fixing the substrate to the curved surface.

14. The method of claim 13, wherein the multi-touch input device comprises a computer mouse, and wherein the curved surface is a body of the computer mouse.

15. The method of claim 13, wherein forming the substrate into the shape that conforms to the curved surface comprises vacuum forming the substrate to form a shaped preform.

16. The method of claim 15, wherein fixing the substrate to the curved surface comprises placing the preform in a mold, and then molding the preform into the body of the multi-touch input device.

17. The method of claim 15, wherein fixing the substrate to the curved surface comprises fixing the preform to the body of the multi-touch input device after forming the body of the multi-touch input device.

18. A method of making a multi-touch input device for a computing device, the method comprising:
    forming on a flexible, insulating substrate a first set of sensor elements, the first set defining a plurality of rows of an array of sensor elements;
    forming on the flexible, insulating substrate a second set of sensor elements, the second set defining a plurality of columns of the array of sensor elements, the rows and columns together defining a plurality of pixels of the multi-touch sensor, each pixel configured to detect touch at a location on the curved surface over that pixel;
    forming a piezoresistive pressure sensor configured to detect touch pressure over the multi-touch input device; and
    forming the substrate into a shape that conforms to the multi-touch input device and fixing the substrate to the multi-touch input device.

19. The method of claim 18, wherein forming the piezoresistive pressure sensor comprises placing a piezoresistive material over the array of sensor elements such that the piezoresistive material is in contact with the array of sensor elements.

20. The method of claim 18, wherein the array of sensor elements is a first array of sensor elements, and wherein forming the pressure sensor comprises forming a second array of sensor elements, placing a piezoresistive material in contact with the second array of sensor elements, and fixing the second array of sensor elements to the multi-touch input device.

* * * * *